United States Patent
Kajiyama

(10) Patent No.: US 7,151,691 B2
(45) Date of Patent: Dec. 19, 2006

(54) MAGNETIC RANDOM ACCESS MEMORY

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/936,693

(22) Filed: Sep. 9, 2004

(65) Prior Publication Data

US 2005/0030813 A1 Feb. 10, 2005

Related U.S. Application Data

(63) Continuation of application No. 10/305,988, filed on Nov. 29, 2002, now Pat. No. 6,807,086.

(30) Foreign Application Priority Data

Nov. 30, 2001 (JP) ............... 2001-367754
Nov. 30, 2001 (JP) ............... 2001-367755
Nov. 30, 2001 (JP) ............... 2001-367941

(51) Int. Cl.
*G11C 11/00* (2006.01)
(52) U.S. Cl. ................ 365/158; 365/173
(58) Field of Classification Search ......... 365/158, 365/173
See application file for complete search history.

(56) References Cited

U.S. PATENT DOCUMENTS

| | | | |
|---|---|---|---|
| 4,791,604 A | 12/1988 | Lienau et al. | |
| 5,969,978 A | 10/1999 | Prinz | |
| 5,991,193 A * | 11/1999 | Gallagher et al. ........... | 365/171 |
| 6,349,054 B1 * | 2/2002 | Hidaka ....................... | 365/173 |
| 6,452,764 B1 | 9/2002 | Abraham et al. | |
| 6,501,679 B1 | 12/2002 | Hidaka | |
| 6,515,897 B1 * | 2/2003 | Monsma et al. ............ | 365/173 |
| 6,577,527 B1 * | 6/2003 | Freitag et al. .............. | 365/158 |
| 6,741,513 B1 * | 5/2004 | Honigschmid et al. ..... | 365/158 |
| 6,777,731 B1 * | 8/2004 | Kreupl ....................... | 257/295 |
| 6,795,334 B1 * | 9/2004 | Iwata et al. ................. | 365/158 |
| 6,859,410 B1 * | 2/2005 | Scheuerlein et al. ... | 365/230.06 |
| 6,861,752 B1 * | 3/2005 | Kajiyama ................... | 257/758 |
| 6,879,515 B1 * | 4/2005 | Yoda et al. ................. | 365/158 |
| 2001/0023992 A1 | 9/2001 | Doll | |

FOREIGN PATENT DOCUMENTS

| | | |
|---|---|---|
| JP | 10-106255 | 4/1998 |
| JP | 2000-76844 | 3/2000 |
| JP | 2000-187976 | 7/2000 |
| JP | 2000-195250 | 7/2000 |

(Continued)

OTHER PUBLICATIONS

R. Scheuerlein, et al., ISSCC2000 Technical Digest, vol. 128, 5 pages, "A 10ns Read and Write Non-Volatile Memory Array Using a Magnetic Tunnel Junction and Fet Switch in Each Cell", Feb. 8, 2000.

*Primary Examiner*—M. Tran
(74) *Attorney, Agent, or Firm*—Oblon, Spivak, McClelland, Maier & Neustadt, P.C.

(57) ABSTRACT

MTJ elements are accumulated in a plurality of portions on a semiconductor substrate. A first conductive line functioning as a read line and extending in the X direction is connected to pin layers of the MTJ elements. A second conductive line functioning as a write line and read line and extending in the X direction is connected to free layers of the MTJ elements. A write line extends in the Y direction and is shared with two MTJ elements present above and below the write line. The two MTJ elements present above and below the write line are arranged symmetric to the write line.

4 Claims, 14 Drawing Sheets

FOREIGN PATENT DOCUMENTS

| | | |
|---|---|---|
| JP | 2001-67862 | 3/2001 |
| JP | 2001-217398 | 8/2001 |
| JP | 2001-236781 | 8/2001 |
| JP | 2001-273757 | 10/2001 |
| JP | 2002-25245 | 1/2002 |
| JP | 2002-203390 | 7/2002 |
| JP | 2002-359355 | 12/2002 |
| JP | 2003-133528 | 5/2003 |
| KR | 2002-0002291 | 1/2002 |

\* cited by examiner

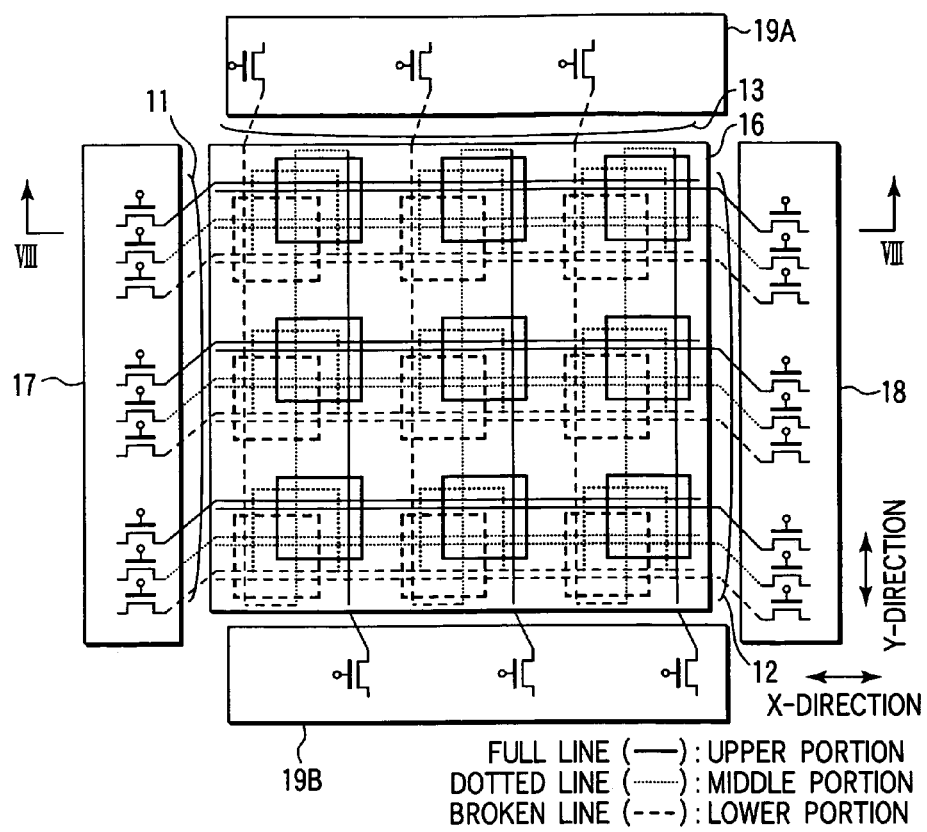
FULL LINE (———): UPPER PORTION
DOTTED LINE (·······): MIDDLE PORTION
BROKEN LINE (---): LOWER PORTION
F I G. 7
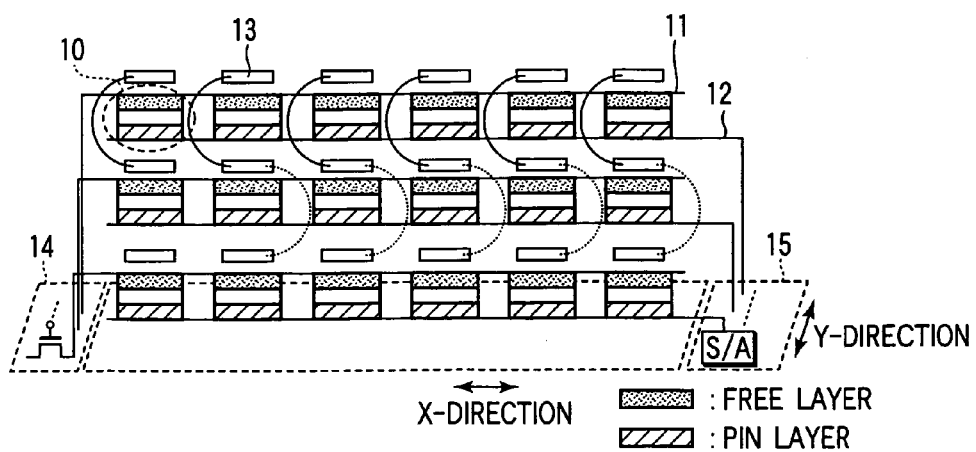
▓▓▓ : FREE LAYER
▨▨▨ : PIN LAYER
F I G. 8

: FREE LAYER
: PIN LAYER

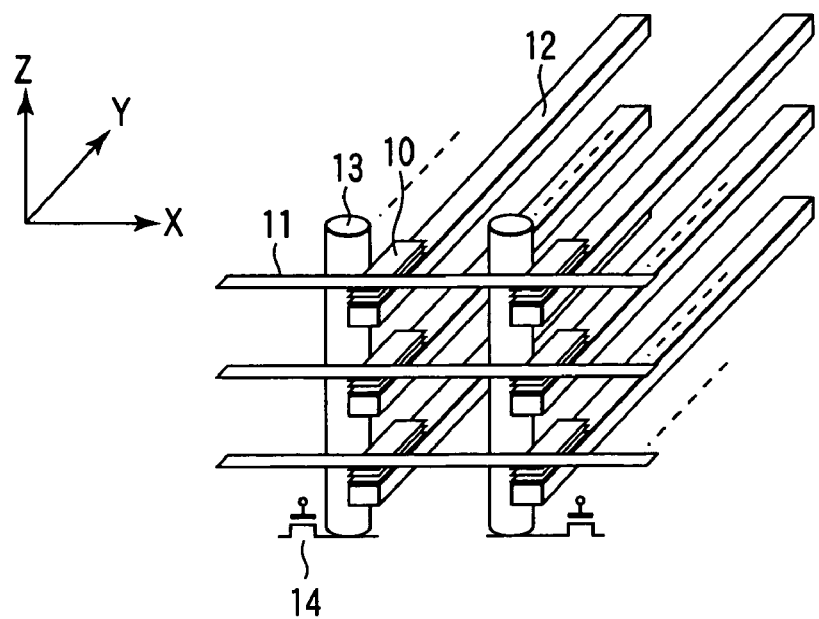
F I G. 21
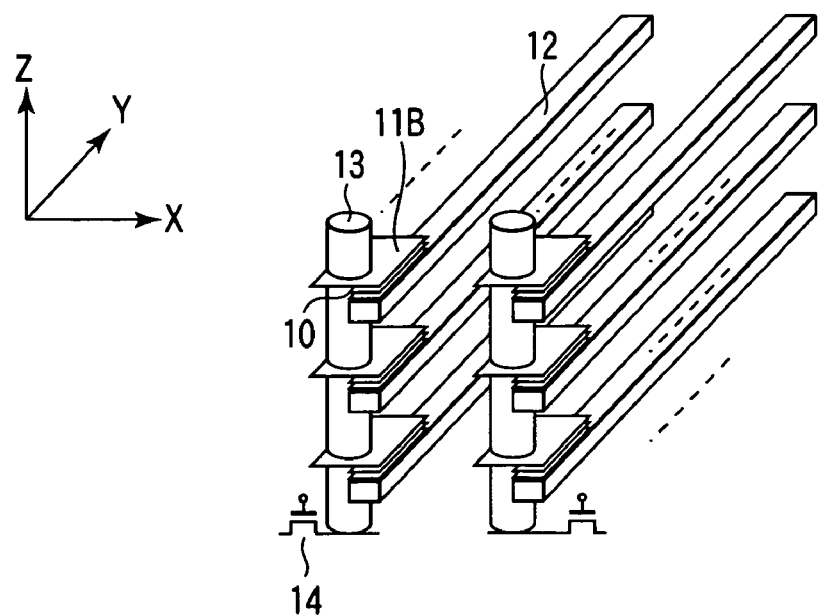
F I G. 22

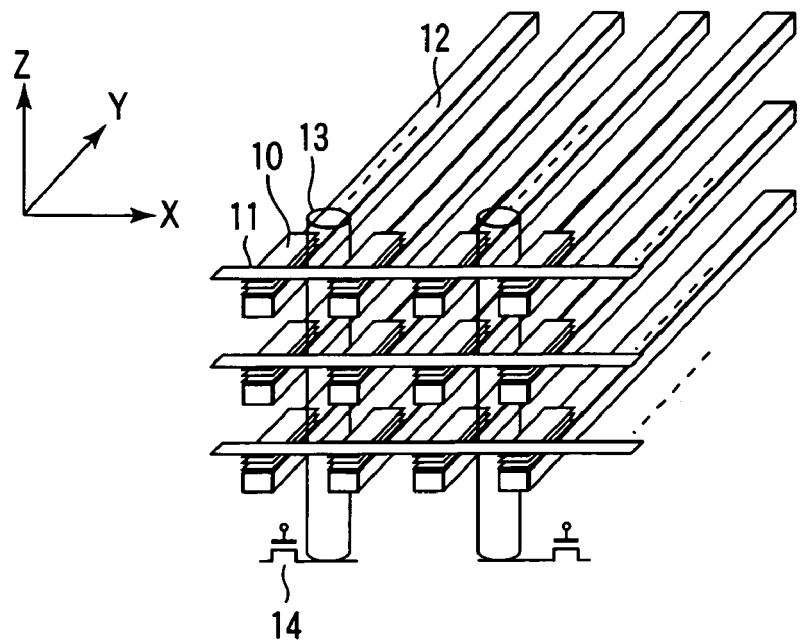
F I G. 23
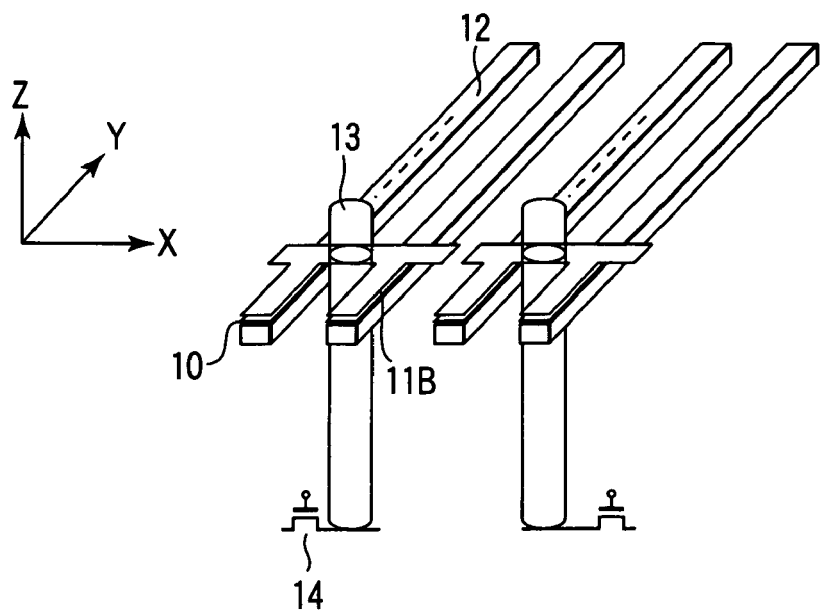
F I G. 24

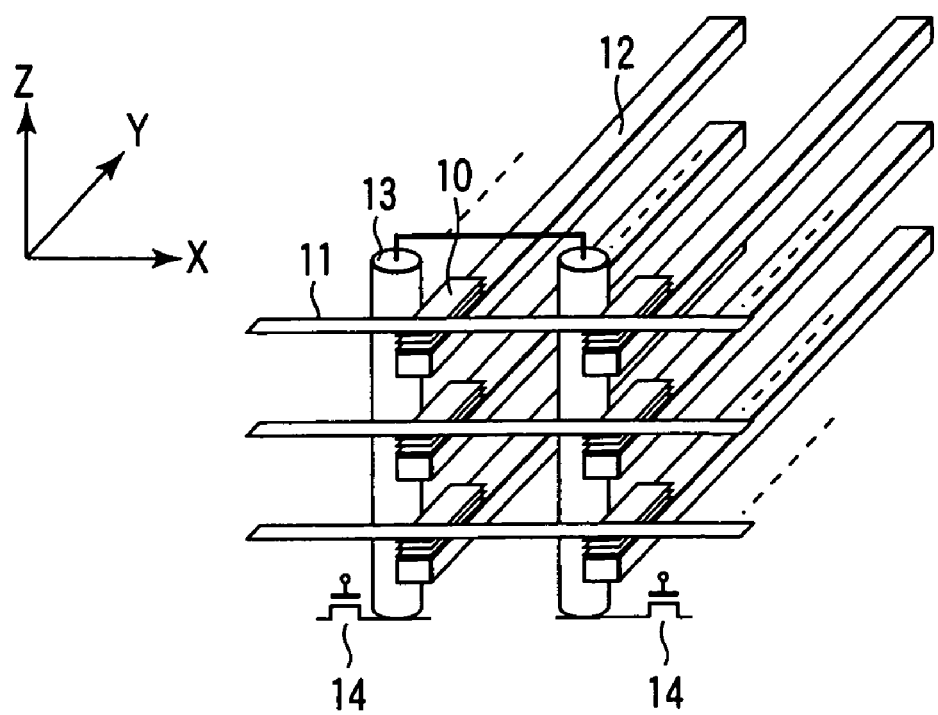
F I G. 27
F I G. 28
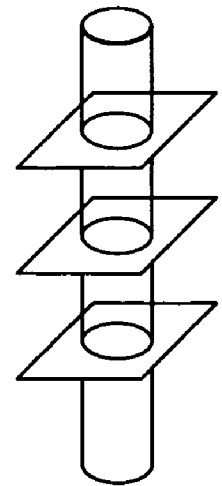
F I G. 29

MAGNETIC RANDOM ACCESS MEMORY

CROSS-REFERENCE TO RELATED APPLICATIONS

This application is a continuation of and claims the benefit of priority from U.S. application Ser. No. 10/305,988, filed Nov. 29, 2002 now U.S. Pat. No. 6,807,086, and from the prior Japanese Patent Applications No. 2001-367754, filed Nov. 30, 2001; No. 2001-367755, filed Nov. 30, 2001; and No. 2001-367941, filed Nov. 30, 2001, the entire contents of all of which are incorporated herein by reference.

BACKGROUND OF THE INVENTION

1. Field of the Invention

The present invention relates to a magnetic random access memory (MRAM) in which a memory cell is constructed using MTJ (Magnetic Tunnel Junction) elements having "1", "0"-information stored therein by a tunneling magneto resistive effect.

2. Description of the Related Art

In recent years, there have been proposed many memories having information stored therein by new principle, and one of them is a memory using a tunneling magneto resistive (hereinafter, denoted as TMR) effect proposed by Roy Scheuerlein et. al (for example, refer to ISSCC2000 Technical Digest p. 128 "A 10 ns Read and Write Non-Volatile Memory Array Using a Magnetic Tunnel Junction and FET Switch in each cell").

The magnetic random access memory stores "1", "0"-information by the MTJ elements. The MTJ elements have a structure in which an insulation layer (tunnel barrier) is sandwiched with two ferromagnetic layers. The information stored in the MTJ elements is determined by whether or not the orientations of spins of the two ferromagnetic layers are parallel or anti-parallel.

Here, parallel means that the orientations of the spins of the two ferromagnetic layers are same, and anti-parallel means that the orientations of the spins of the two ferromagnetic layers are opposite to each other.

Generally, one of the two ferromagnetic layers constructing the MTJ element is a pin layer in which the orientation of the spin is pinned. When "1", "0"-information is stored in the MTJ elements, the orientation of the other one (free layer) of the two ferromagnetic layers is varied according to written information.

BRIEF SUMMARY OF THE INVENTION

A magnetic random access memory according to a first aspect of the present invention comprises: first and second MTJ elements each configured with a first magnetic layer in which the orientation of a spin is pinned, a second magnetic layer in which data is stored, and an insulation layer sandwiched between the first and second magnetic layers; and a first write line which is arranged between the first and second MTJ elements and generates magnetic fields acting on the first and second MTJ elements. A positional relationship between the first magnetic layer, the insulation layer, and the second magnetic layer constructing the first MTJ element and the first magnetic layer, the insulation layer, and the second magnetic layer constructing the second MTJ element is symmetric to the first write line.

A magnetic random access memory according to a second aspect of the present invention comprises: an array having a plurality of MTJ elements accumulated in a plurality of portions; a first conductive line arranged in the array; and a second conductive line arranged in the array which has the same function as the first conductive line and is arranged above the first conductive line, wherein the first and second conductive lines are connected in serial.

A magnetic random access memory according to a third aspect of the present invention comprises: an array having a plurality of MTJ elements accumulated in a plurality of portions; and a first write line which extends in the direction in which the plurality of MTJ elements are accumulated and is provided for generating a magnetic field during writing.

BRIEF DESCRIPTION OF THE SEVERAL VIEWS OF THE DRAWING

FIG. 7 is a plan view showing a first embodiment of the invention relating to the serial/parallel connection wiring;

FIG. 8 is a section view along the X direction of a structure of FIG. 7;

FIG. 21 is a perspective view showing a first embodiment of the invention relating to the three-dimensional wiring;

FIG. 22 is a perspective view showing a second embodiment of the invention relating to the three-dimensional wiring;

FIG. 23 is a perspective view showing a third embodiment of the invention relating to the three-dimensional wiring;

FIG. 24 is a perspective view showing a fourth embodiment of the invention relating to the three-dimensional wiring;

FIG. 27 is a perspective view showing a sixth embodiment of the invention relating to the three-dimensional wiring;

FIG. 28 is a perspective view showing a seventh embodiment of the invention relating to the three-dimensional wiring; and FIG. 29 is a perspective view showing the seventh embodiment of the invention relating to the three-dimensional wiring.

DETAILED DESCRIPTION OF THE INVENTION

Hereinafter, a magnetic random access memory according to embodiments of the present invention will be described in detail with reference to the drawings.

(1) Presupposed Technique

In recent years, various MRAMs of device structure or circuit structure have been proposed, and one of them has a device structure in which a plurality of MTJ elements are connected to one switching element (selective transistor). This structure is advantageous for high density of cells or improvement of read margins.

Figure 1:
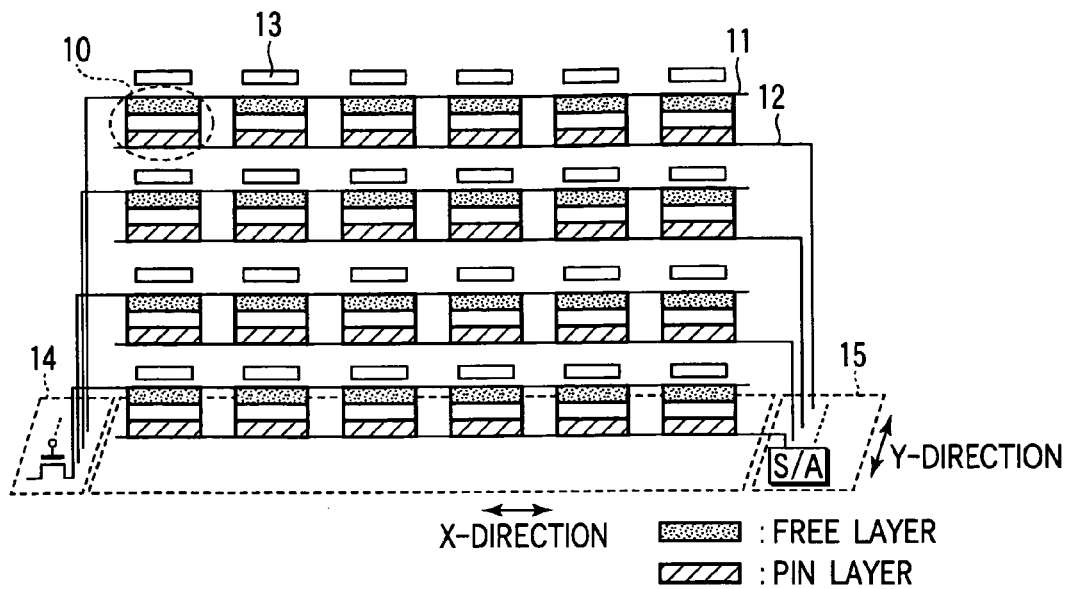
FIG. 1 is a section view showing a reference example of the invention relating to a wiring sharing.

For example, in a ladder type cell structure, a plurality of MTJ elements are connected in parallel between upper lines and lower lines. In this cell structure, as shown in FIG. 1, a plurality of MTJ elements 10 are accumulated in a plurality of portions (in this example, four portions) on a substrate. Further, in each portion, a plurality of MTJ elements 10 are connected in parallel between upper lines 11 and lower lines 12.

The upper lines 11 extend in the X direction, and one ends thereof are connected to selective transistors 14. The lower lines 12 also extend in the X direction, and one ends thereof are connected to peripheral circuits such as sense amplifiers (S/A) 15. In this example, a read current flows in the path from the upper lines 11 through the MTJ elements 10 to the lower lines 12, that is along the X direction. Write lines 13 are arranged adjacent to the MTJ elements 10, and extend in the Y direction.

Figure 2:
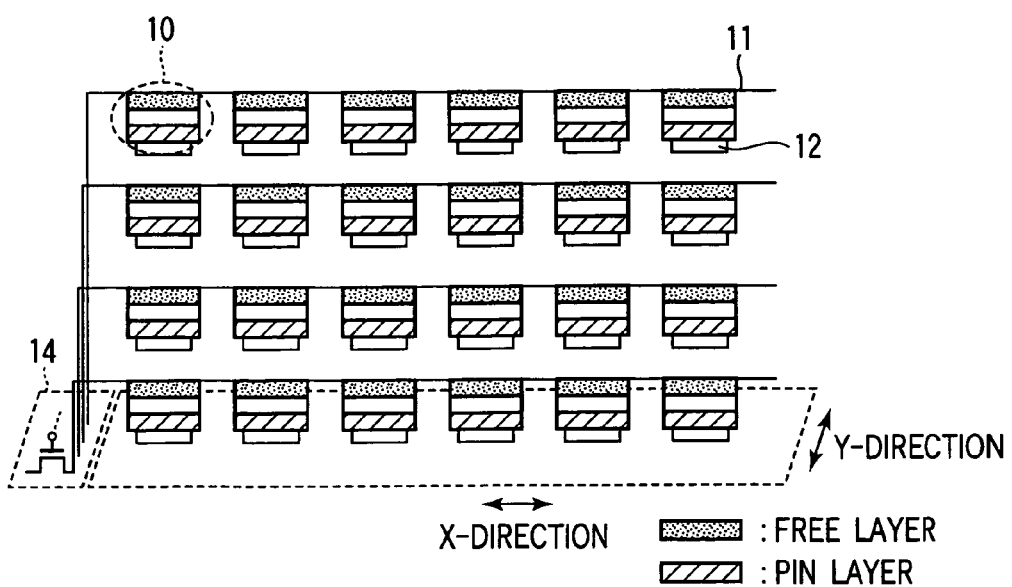
FIG. 2 is a section view showing the reference example of the invention relating to the wiring sharing.

The cell structure of FIG. 2 is an example in which the lower line in FIG. 1 and the write line are integrated. In other words, the lower line 12 extends in the Y direction, and one end thereof is connected to the sense amplifier (S/A). During writing, the lower line 12 functions as a write line. During reading, the lower line 12 functions as a read line. That is, the read current flows through the upper line (X direction) 11 at first, and then flows via the MTJ elements 10 to the lower line (Y direction) 12.

A basic structure of a cell of the magnetic random access memory is a 1 cell-1 transistor structure in which one switching element (selective transistor) is corresponded to one MTJ element. However, in the device structure in which the MTJ elements are accumulated in a plurality of portions, when one switching element is corresponded to one MTJ element, the number of switching elements becomes larger, which is disadvantageous for high density of cells.

In the case of the device structure in which the MTJ elements 10 are accumulated in a plurality of portions, there is employed the device structure in which, even when one switching element is not corresponded to one MTJ element, read operation or write operation can be performed.

For example, in the device structure shown in FIGS. 1 and 2, a plurality of MTJ elements 10 are connected between the upper lines 11 and the lower lines 12 in each portion of an array of the MTJ elements 10. Further, for example, the selective transistors 14 are connected to one ends of the upper lines 11, and the sense amplifiers (S/A) 15 are connected to one ends of the lower lines 12.

However, in this case, in the example of FIG. 1, three lines of the upper line (read/write line) 11, the lower line (read line) 12, and the write line 13 in total have to be arranged in each portion of the array of the MTJ elements 10. Further, in the example of FIG. 2, two lines of the upper line (read/write line) 11 and the lower line (read/write line) 12 in total have to be arranged in each portion of the array of the MTJ elements 10.

In the case where such a write line or read line (current path line) is arranged in the array of the MTJ elements accumulated in a plurality of portions on the substrate, when the number of accumulated portions of the MTJ elements becomes larger, there arise the problems that the device structure becomes complicated and process cost is increased due to increase in the number of manufacturing steps.

Further, the characteristics of the MTJ elements are largely influenced by the flatness of the surfaces (base films) on which the MTJ elements are arranged. Since this flatness is more affected when the number of accumulated portions of the MTJ elements becomes larger, there is a problem that the characteristics of the MTJ elements are deteriorated along with the increase in the number of accumulated portions of the MTJ elements.

(2) Outline

The embodiments according to the present invention (sharing of wiring) are applied to a magnetic random access memory having an array structure in which the MTJ elements are accumulated in a plurality of portions. The magnetic random access memory according to the embodiments of the present invention is characterized in that one of two write lines required for one MTJ element is shared with two MTJ elements adjacent in the vertical direction. Further, the two MTJ elements are arranged symmetric to each other relative to the shared write line.

Accordingly, the number of conductive lines arranged in the array of the MTJ elements can be decreased so that reduction of process cost can be achieved by reduction of the number of manufacturing steps. In addition, deterioration of the flatness along with the increase in the number of accumulated portions of the MTJ elements can also be restricted, thereby improving the characteristics of the MTJ elements.

(3) Embodiments

① First Embodiment

Figure 3:
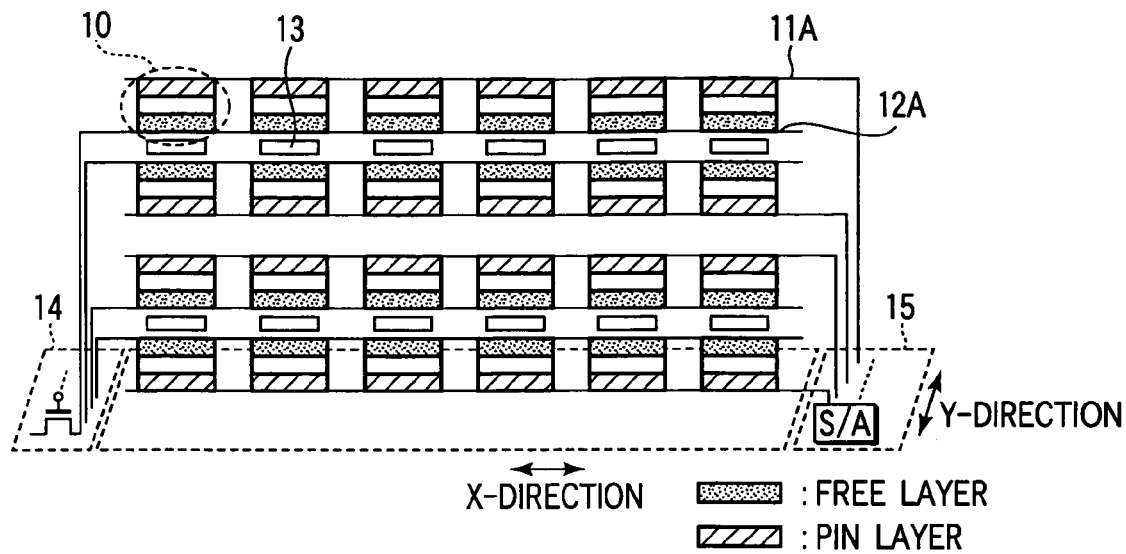
FIG. 3 is a section view showing a first embodiment of the invention relating to the wiring sharing.

FIG. 3 shows a cell array section of a magnetic random access memory according to a first embodiment of the present invention.

A plurality of MTJ elements 10 are accumulated in a plurality of portions (in the present embodiment, four portions) on the semiconductor substrate. The MTJ elements 10 construct the array in the X-Y plane in each portion. In FIG. 3, the MTJ elements along the Y direction are omitted.

The write line 13 is arranged between two MTJ elements 10 adjacent in the vertical direction, and extends in the Y direction. In the present embodiment, since the write line 13 is shared with two MTJ elements adjacent in the vertical direction, the following cell structure is employed. In other words, the write lines 13 are not arranged between all the portions, but are arranged, for example, immediately above the MTJ elements 10 in the odd portions and immediately below the MTJ elements 10 in the even portions from the semiconductor substrate side.

In the present embodiment, the write lines 13 are arranged between the MTJ elements in the first portion and the MTJ elements in the second portion, and between the MTJ elements in the third portion and the MTJ elements in the fourth portion from the semiconductor substrate side, respectively. That is, the write line 13 is not arranged between the MTJ elements in the second portion and the MTJ elements in the third portion from the semiconductor substrate side.

Further, in the present embodiment, two MTJ elements present above and below the write line 13 are arranged symmetric to each other relative to the write line 13.

More specifically, the MTJ element 10 is configured with two magnetic layers (ferromagnetic layers) and an insulation layer (tunnel barrier) sandwiched therewith, where a pin layer in which the orientation of a spin is pinned of the two magnetic layers is arranged far away from the write line 13. Further, a free layer in which the orientation of the spin can be freely changed of the two magnetic layers is arranged near the write line 13. The write line 13 is positioned equidistantly from the two MTJ elements 10 present above and below the write line 13, and is separated from the two MTJ elements 10.

In each portion, a first conductive line 11A functioning as a read line is connected to the pin layer of the MTJ element 10. The first conductive line 11A extends in the X direction, and is commonly connected to the pin layers of a plurality of MTJ elements 10 arranged in the X direction. The sense amplifier (S/A) 15 is connected to one end of the first conductive line 11A.

Further, in each portion, a second conductive line 12A functioning as a write line and read line is connected to the free layer of the MTJ element 10. The second conductive line 12A extends in the X direction, and is commonly connected to the free layers of a plurality of MTJ elements 10 arranged in the X direction. The switching element 14 functioning as a selective transistor is connected to one end of the second conductive line 12A.

According to such a cell structure of the first embodiment, one of two write lines required for writing data in one MTJ element is shared with two MTJ elements adjacent in the vertical direction. In this way, it is possible to reduce the number of conductive lines arranged in the array of the MTJ elements so that the reduction of process cost can be achieved by the reduction of the number of manufacturing steps. Moreover, the deterioration of the flatness along with the increase in the number of accumulated portions of the MTJ elements can also be restricted, thereby improving the characteristics of the MTJ elements.

Further, according to the cell structure of the first embodiment, two MTJ elements arranged above and below the write line are arranged symmetric to each other relative to the write line. Thereby, with respect to the magnetic fields generated by the current flowing through the write line, the intensities of the magnetic fields acting on the free layers of the two MTJ elements arranged above and below the write line are substantially same so that it is possible to restrict variations of the magnetic fields acting on the respective MTJ elements.

② Second Embodiment

Figure 4:
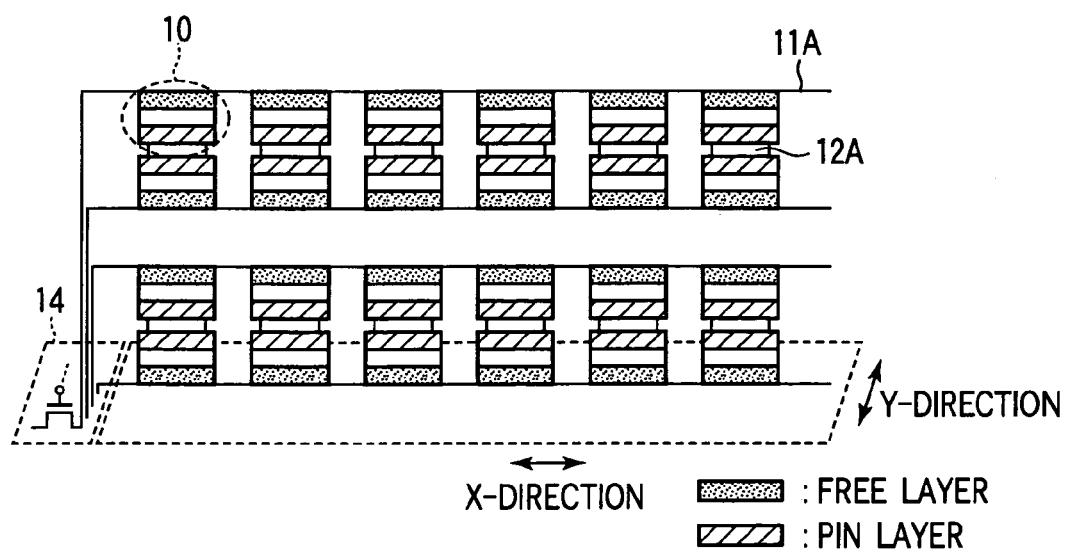
FIG. 4 is a section view showing a second embodiment of the invention relating to the wiring sharing.

FIG. 4 shows a cell array section of a magnetic random access memory according to a second embodiment of the present invention.

The magnetic random access memory according to the present embodiment is characterized in that the read lines 12A of FIG. 3 are omitted and the write lines 13 of FIG. 3 each have a function as a read line as compared with the magnetic random access memory of FIG. 3.

A plurality of MTJ elements 10 are accumulated in a plurality of portions (in the present embodiment, four portions) on the semiconductor substrate. Further, the MTJ elements 10 construct the array in the X-Y plane in each portion. In FIG. 4, the MTJ elements along the Y direction are omitted.

In each portion, the first conductive line 11A functioning as a write line and read line is connected to the free layer of the MTJ element 10. The first conductive line 11A extends in the X direction, and is commonly connected to the free layers of a plurality of MTJ elements 10 arranged in the X direction. The switching element 14 as a selective transistor is connected to one end of the first conductive line 11A.

Further, in each portion, the second conductive line 12A functioning as a write line and read line is connected to the pin layer of the MTJ element 10. The second conductive line 12A extends in the Y direction, and is commonly connected to the pin layers of a plurality of MTJ elements 10 arranged in the Y direction. The sense amplifier (S/A) is connected to one end of the second conductive line 12A.

The second conductive line 12A is arranged between two MTJ elements 10 adjacent in the vertical direction. In other words, the second conductive line 12A is shared with two MTJ elements adjacent in the vertical direction. Therefore, the second conductive lines 12A are not arranged between all the portions, but are arranged, for example, immediately above the MTJ elements 10 in the odd portions, and immediately below the MTJ elements 10 in the even portions from the semiconductor substrate side.

In the present embodiment, the second conductive lines 12A are arranged between the MTJ elements in the first portion and the MTJ elements in the second portion, and between the MTJ elements in the third portion and the MTJ elements in the fourth portion from the semiconductor substrate side, respectively. That is, the second conductive line 12A is not arranged between the MTJ elements in the second portion and the MTJ elements in the third portion from the semi-conductor substrate side.

Further, in the present embodiment, two MTJ elements present above and below the second conductive line 12A are arranged symmetric to each other relative to the second conductive line 12A. In other words, the MTJ element 10 is configured with two magnetic layers (ferromagnetic layers) and an insulation layer (tunnel barrier) sandwiched therewith, where the pin layer in which the orientation of the spin is pinned of the two magnetic layers is near the second conductive line 12A. Further, the free layer in which the orientation of the spin can be freely changed of the two magnetic layers is arranged far away from the second conductive line 12A.

According to such a cell structure of the second embodiment, one of two write lines required for writing data in one MTJ element is shared with two MTJ elements adjacent in the vertical direction. Since a write-only conductive line or a read-only conductive line is eliminated and one conductive line is used for both writing and reading, the number of conductive lines can be remarkably reduced. In the present embodiment, the number of conductive lines for one MTJ element is substantially 1.5. This enables to achieve the reduction of process cost by the reduction of the number of manufacturing steps. Moreover, it is possible to restrict the deterioration of the flatness along with the increase in the number of accumulated portions of the MTJ elements, thereby improving the characteristics of the MTJ elements.

In addition, according to the cell structure of the second embodiment, two MTJ elements arranged above and below the write line are arranged to be symmetric to each other relative to the write line. In this way, with respect to the magnetic fields generated by the current flowing through the write line, the intensities of the magnetic fields acting on the free layers of the two MTJ elements arranged above and below the write line are substantially same so that it is possible to restrict the variations of the magnetic fields acting on the respective MTJ elements.

③ Third Embodiment

Figure 5:
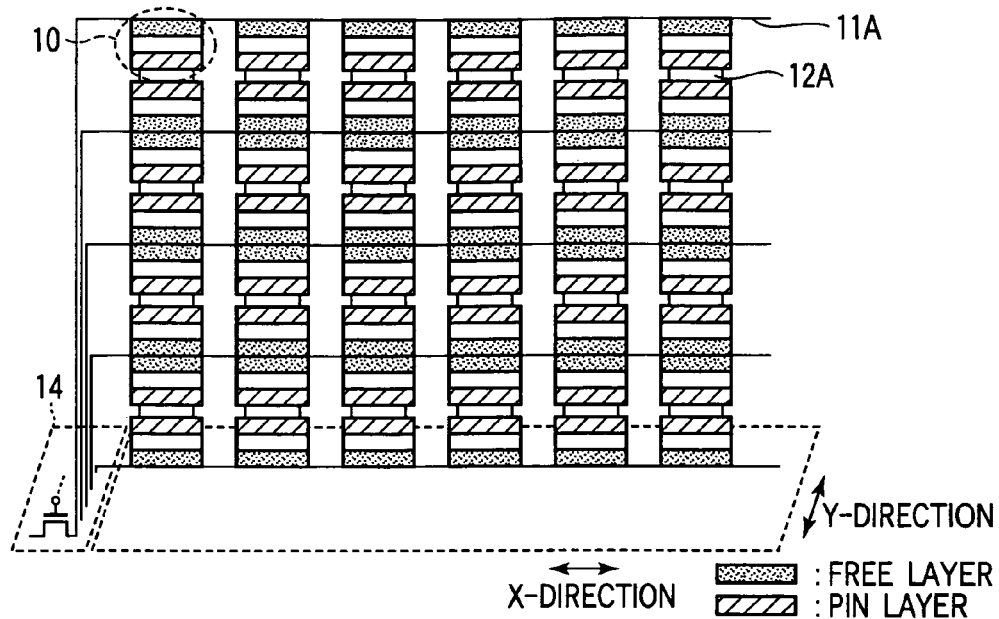
FIG. 5 is a section view showing a third embodiment of the invention relating to the wiring sharing.

FIG. 5 shows a cell array section of a magnetic random access memory according to a third embodiment of the present invention.

The magnetic random access memory according to the present embodiment is characterized in that the first conductive line (write line and read line) 11A of FIG. 4 is shared with two MTJ elements adjacent in the vertical direction as compared with the magnetic random access memory of FIG. 4.

A plurality of MTJ elements 10 are accumulated in a plurality of portions (in the present embodiment, eight portions) on the semiconductor substrate. Further, the MTJ elements 10 construct the array in the X-Y plane in each portion. In FIG. 5, the MTJ elements along the Y direction are omitted.

In each portion, the first conductive line 11A functioning as a write line and read line is connected to the free layer of the MTJ element 10. The first conductive line 11A extends in the X direction, and is commonly connected to the free layers of a plurality of MTJ elements 10 arranged in the X direction. The switching element 14 as a selective transistor is connected to one end of the first conductive line 11A.

The first conductive line 11A is arranged between two MTJ elements 10 adjacent in the vertical direction. More specifically, the first conductive line 11A is shared with two MTJ elements adjacent in the vertical direction. Therefore, the first conductive lines 11A are not arranged between all the portions, but are arranged, for example, immediately below the MTJ elements 10 in the odd portions, and immediately above the MTJ elements 10 in the even portions from the semiconductor substrate side.

In the present embodiment, the first conductive lines 11A are arranged immediately below the MTJ elements in the first portion, between the MTJ elements in the second portion and the MTJ elements in the third portion, between the MTJ elements in the fourth portion and the MTJ elements in the fifth portion, between the MTJ elements in the sixth portion and the MTJ elements in the seventh portion, and immediately above the MTJ elements in the eighth portion from the semiconductor substrate, respectively.

Further, in the present embodiment, two MTJ elements present above and below the first conductive line 11A are arranged symmetric to each other relative to the first conductive line 11A. In other words, the MTJ element 10 is configured with two magnetic layers (ferromagnetic layers) and an insulation layer (tunnel barrier) sandwiched therewith, where the pin layer in which the orientation of the spin is pinned of the two magnetic layers is arranged far away from the first conductive line 11A. The free layer in which the orientation of the spin can be freely changed of the two magnetic layers is arranged near the first conductive line 11A.

Moreover, in each portion, the second conductive line 12A functioning as a write line and read line is connected to the pin layer of the MTJ element 10. The second conductive line 12A extends in the Y direction, and is commonly connected to the pin layers of a plurality of MTJ elements 10 arranged in the Y direction. The sense amplifier (S/A) is connected to one end of the second conductive line 12A.

The second conductive line 12A is arranged between two MTJ elements 10 adjacent in the vertical direction. That is, the second conductive line 12A is shared with two MTJ elements adjacent in the vertical direction. Therefore, the second conductive lines 12A are not arranged between all the portions, are arranged, for example, immediately above the MTJ elements 10 in the odd portions and immediately below the MTJ elements 10 in the even portions from the semiconductor substrate side.

In the present embodiment, the second conductive lines 12A are arranged between the MTJ elements in the first portion and the MTJ elements in the second portion, between the MTJ elements in the third portion and the MTJ elements in the fourth portion, between the MTJ elements in the fifth portion and the MTJ elements in the sixth portion, and between the MTJ elements in the seventh portion and the MTJ elements in the eighth portion from the semiconductor substrate side, respectively.

Further, in the present embodiment, two MTJ elements present above and below the second conductive line 12A are arranged symmetric to each other relative to the second conductive line 12A. In other words, the MTJ element 10 is configured with two magnetic layers (ferromagnetic layers) and an insulation layer (tunnel barrier) sandwiched therewith, where the pin layer in which the orientation of the spin is pinned of the two magnetic layers is arranged near the second conductive line 12A. Moreover, the free layer in which the orientation of the spin can be freely changed of the two magnetic layers is arranged far away from the second conductive line 12A.

According to such a cell structure of the third embodiment, the conductive line connected to the free layers of the MTJ elements and the conductive line connected to the pin layers are set to the lines each capable of being used as a write line and read line, respectively, and are each shared with two MTJ elements adjacent in the vertical direction.

Thereby, the number of conductive lines arranged in the array of the MTJ elements can be remarkably reduced so that the reduction of process cost can be achieved by the reduction of the number of manufacturing steps. Further, it is also possible to restrict the deterioration of the flatness along with the increase in the number of accumulated portions of the MTJ elements, thereby improving the characteristics of the MTJ elements.

In addition, according to the cell structure of the third embodiment, two MTJ elements arranged above and below the write line are arranged to be symmetric to each other relative to the write line. In this way, with respect to the magnetic fields generated by the current flowing through the write line, the intensities of the magnetic fields acting on the free layers of the two MTJ elements arranged above and below the write line are substantially same so that it is possible to restrict the variations of the magnetic fields acting on the respective MTJ elements.

(4) Others

In the first to third embodiments described above, description is made on the premise of a device in which the write line (or read line) is commonly connected to the MTJ elements in the X direction or Y direction in each portion of the array structure in which a plurality of MTJ elements are accumulated in a plurality of portions, but an application of the present invention is not limited to such a device.

In the present invention, the magnetic random access memory having an array structure in which a plurality of MTJ elements are accumulated in a plurality of portions can be applied to any devices having any structure.

Further, in the first to third embodiments described above, the transistors connected to the lines in the array of the MTJ elements are generally MOS transistors, but may be bipolar transistors, diodes, or the like.

(5) Conclusion

Hereinbefore, as described above, according to the magnetic random access memory of the embodiments of the present invention, when at least one of the write lines is shared with MTJ elements present above and below the write line, the number of conductive lines arranged in the array of the MTJ elements can be reduced so that the reduction of process cost can be achieved by the reduction of the number of manufacturing steps. In addition, since the number of conductive lines arranged in the array of the MTJ elements is reduced, it is possible to restrict the deterioration of the flatness along with the increase in the number of accumulated portions of the MTJ elements, thereby improving the characteristics of the MTJ elements.

2. Serial (Meandering)/Parallel Connection Wiring

(1) Presupposed Technique

A basic structure of the magnetic random access memory is a 1 cell-1 transistor structure in which one switching element (selective transistor) is corresponded to one MTJ element. However, in the device structure in which the MTJ elements are accumulated in a plurality of portions, when one switching element is corresponded to one MTJ element, the number of switching elements is increased, which is disadvantageous for high density of the cells.

In the case of the device structure in which the MTJ elements 10 are accumulated in a plurality of portions, there is employed the device structure in which read operation or write operation can be conducted even when one switching element is not corresponded to one MTJ element.

For example, in the device structure shown in FIGS. 1 and 2, in each portion of the array of the MTJ elements 10, a plurality of MTJ elements 10 are connected between the upper line 11 and the lower line 12. Then, for example, the selective transistor 14 is connected to one end of the upper line 11, and the sense amplifier (S/A) 15 is connected to one end of the lower line 12.

Figure 6:
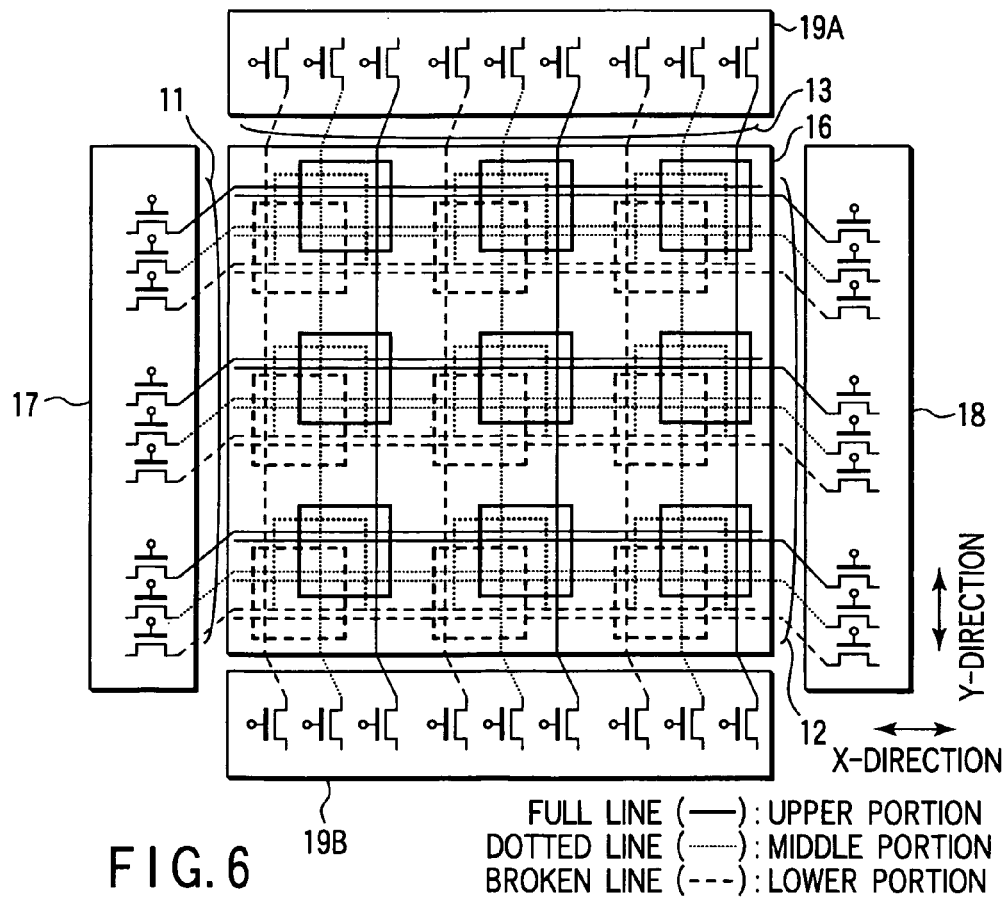
FIG. 6 is a plan view showing a reference example of the invention relating to a serial/parallel connection wiring.

However, in this case, in the example of FIG. 1, the selective transistors are required for the respective upper lines 11 arranged in each portion of the array of the MTJ elements 10. Further, as shown in FIG. 6, the upper lines 11 extend in the X direction on the array 16 of the MTJ elements 10. In other words, the selective transistors connected to the upper lines 11 are intensively arranged in an area 17 at the end of the array 16.

Similarly, the sense amplifiers (transistors) are required for the respective lower lines (read lines) 12 arranged in each portion of the array of the MTJ elements 10. That is, as shown in FIG. 6, since the lower lines 12 extend in the X direction on the array 16 of the MTJ elements 10, the transistors connected to the lower lines 12 are intensively arranged in an area 18 at the end of the array 16.

Similarly, the selective transistors are also required for the respective write lines 13 arranged in each portion of the array of the MTJ elements 10. In other words, as shown in FIG. 6, since the write lines 13 extend in the Y direction on the array 16 of the MTJ elements 10, the selective transistors connected to the write lines 13 are intensively arranged in areas 19A and 19B at the end of the array 16.

In data write/read operation with respect to the MTJ elements, it is known that a large current is required due to the characteristics of the MTJ elements. Therefore, it is expected that the size of the transistors connected to the upper lines 11, lower lines 12, and the write lines 13 inevitably becomes larger.

Therefore, the area of the areas 17, 18, 19A, and 19B arranged on the periphery of the array 16 in which the transistors for current driving are arranged is also increased so that it is impossible to achieve reduction of the chip size, reduction of process cost per chip, and the like. In addition, since the number of selective transistors is also increased in proportion to the number of accumulated portions of the MTJ elements, when the number of accumulated portions of the MTJ elements is remarkably increased, a great deal of time is required for the layout of the selective transistors, which causes long development time.

(2) Outline

Embodiments of the present invention (serial/parallel connection wiring) are applied to a magnetic random access memory having an array structure in which the MTJ elements are accumulated in a plurality of portions.

The magnetic random access memory according to the embodiments of the present invention is characterized in that a plurality of conductive lines (for example, write lines, read lines, or the like) having the same function which are arranged by one line per portion are connected in serial or in parallel in one row or column of the array of the MTJ elements. In this case, the transistors may be arranged by one transistor at one ends or both ends of the conductive lines connected in serial/in parallel, respectively so that the number of transistors arranged at the end of the array of the MTJ elements can be decreased.

Further, according to the device structure of the embodiments of the present invention, the transistors may be connected to the conductive lines connected in serial or in parallel in one row or column of the array of the MTJ elements irrespective of the number of accumulated portions of the MTJ elements. Accordingly, even when the number of accumulated portions of the MTJ elements is increased and increase in the memory capacity is achieved, the number of transistors is not increased and the layout thereof does not become complicated.

Moreover, in one row or column of the array of the MTJ elements, since the number of transistors is always constant irrespective of the number of accumulated portions of the MTJ elements, assuming that the array of the MTJ elements is one small block, a large memory cell array may be configured with a plurality of blocks. In this case, core circuits of the transistors or the sense amplifiers may be arranged immediately below the array of the MTJ elements.

(3) Embodiments

① First Embodiment

FIG. 7 shows a layout of a cell array section of a magnetic random access memory according to a first embodiment of the present invention. FIG. 8 shows a section along the X direction of the cell array section of FIG. 7, that is a section along the line VIII—VIII of FIG. 7.

A plurality of MTJ elements 10 are accumulated in a plurality of portions (in the present embodiment, three portions) on the semiconductor substrate. Further, the MTJ elements 10 construct the array in the X-Y plane in each portion.

The upper line 11 and the lower line 12 both extend in the X direction, and a plurality of MTJ elements 10 arranged in the X direction are arranged between both the lines 11 and 12. The selective transistor 14 is connected to one end of the upper line 11. Further, the peripheral circuit such as the sense amplifier (S/A) 15 is connected to one end of the lower line 12.

In the present embodiment, the upper line 11 and the lower line 12 each function as a read line. In other words, the read current flows in the path from the upper line 11 through the MTJ elements 10 to the lower line 12, that is along the X direction during data reading.

As a specific reading method, at first, the read current is flowed through the upper line 11 and the lower line 12, and the potential of the lower line 12 at this time is detected by the sense amplifier, for example. Next, predetermined data ("0" or "1") is written into the selected MTJ elements (memory cells), and then the read current is flowed through the upper line 11 and the lower line 12 again, and the potential of the lower line 12 at this time is detected by the sense amplifier. Between the first and second readings, when the potentials detected by the sense amplifier are same, data of the selected MTJ elements is determined to be same as the predetermined data, and when the potentials are different from each other, the data of the selected MTJ elements is determined to be different from the predetermined data. Finally, correct data is rewritten into the selected MTJ elements.

The write lines 13 are arranged above the MTJ elements 10 and extend in the Y direction in each portion of the array of the MTJ elements 10. Further, the write lines 13 are arranged in the vicinity of the free layers of the MTJ elements 10. Moreover, when a group of a plurality of MTJ elements arranged in the X direction is assumed to be one column and a group of a plurality of MTJ elements arranged in the Y direction is assumed to be one row, the write lines 13 arranged in each portion are connected in serial in one row of the array of the MTJ elements 10 in the present embodiment.

Figure 9:
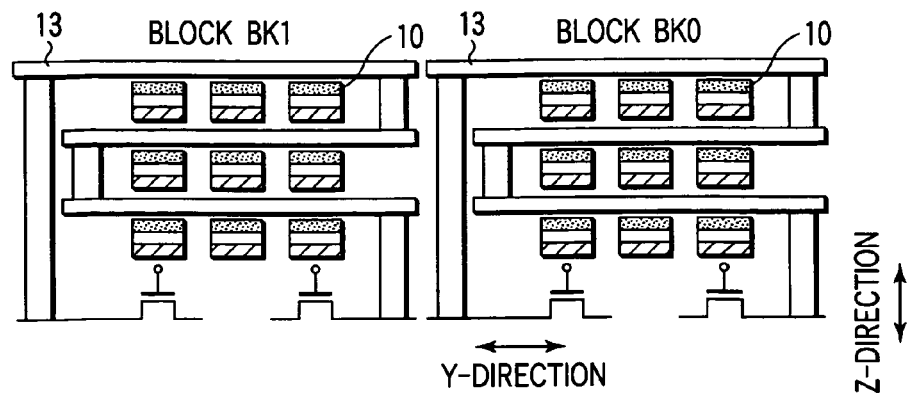
FIG. 9 is a section view along the Y direction of the structure of FIG. 7.

More specifically, as shown in FIG. 9, the write line 13 in the upper portion and the write line 13 in the lower portion are electrically connected to each other via contact plugs at the end of the array of the MTJ elements 10. In FIG. 9, the upper lines and the lower lines are omitted for simplicity.

As a specific writing method, for example, a write current in one direction or another direction is flowed according to a value of the write data through the lower line 12 functioning as a write line in one selected column. Simultaneously, the write current in one direction is flowed through the write line 13 in one selected row. In this way, the predetermined data is written into the MTJ elements (memory cells) 10 arranged between the lower line 12 and the write line 13.

As described above, in the present embodiment, the lines having the same function arranged in each portion, that is the write lines are connected in serial in one row of the array of the MTJ elements 10 so that the transistors may be arranged by one transistor at both ends of the write line. This allows to remarkably reduce the number of transistors arranged in the areas 19A and 19B at the end of the array 16 of the MTJ elements 10.

Further, according to such a device structure, the transistor may be connected to the conductive line connected in serial in one row of the array 16 of the MTJ elements 10 irrespective of the number of accumulated portions of the MTJ elements 10. Therefore, even when the number of accumulated portions of the MTJ elements 10 is increased so that the increase in the memory capacity is achieved, the number of transistors is not increased and the layout thereof does not become complicated.

In addition, since the number of transistors connected to the write lines 13 arranged in each portion in one row of the array 16 of the MTJ elements 10 is always constant, assuming that the array 16 of the MTJ elements 10 is one small block, a large memory cell array may be constructed by a plurality of blocks. In this case, for example, as shown in FIG. 9, the core circuits such as the transistors or sense amplifiers may be arranged immediately below the MTJ elements 10 in each block.

In FIG. 7, the accumulated MTJ elements, the lines extending in the X direction, and the lines extending in the Y direction are described to be shifted from each other in each portion, respectively. But this is directed for simplifying the description, and actually they may be shifted from each other, or may be fully overlapped.

② Second Embodiment

Figure 10:
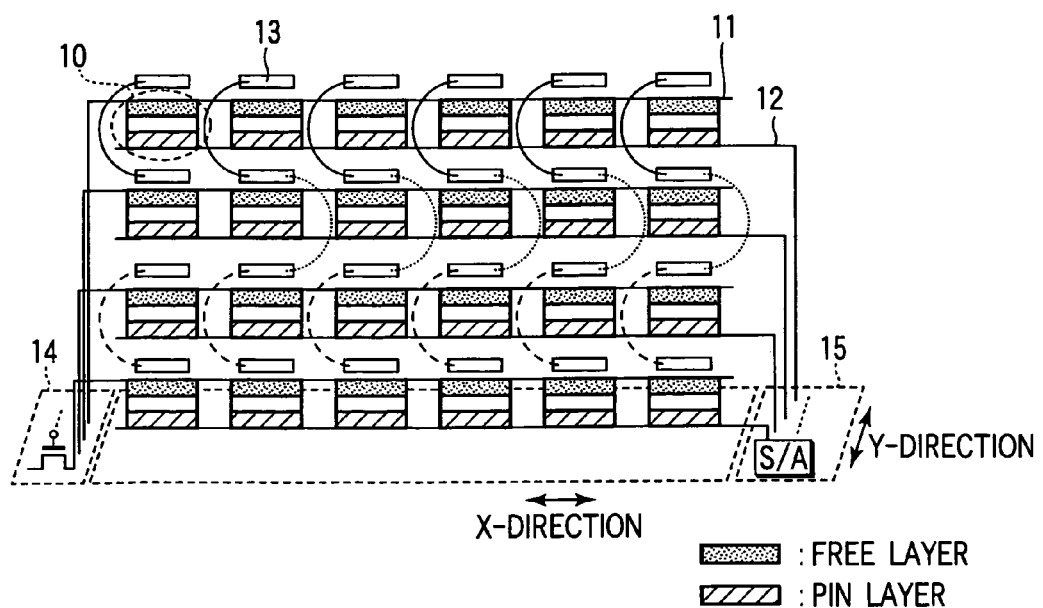
FIG. 10 is a section view showing a second embodiment of the invention relating to the serial/parallel connection wiring.

FIG. 10 shows a cell array section of a magnetic random access memory according to a second embodiment of the present invention.

The magnetic random access memory according to the present embodiment is characterized in that the number of accumulated portions of the MTJ elements 10 of FIG. 8 is set to be four as compared with the magnetic random access memory of FIG. 8, and other points are same as the magnetic random access memory of FIG. 8.

A plurality of MTJ elements 10 are accumulated in a plurality of portions (in the present embodiment, four portions) on the semiconductor substrate. Further, the MTJ elements 10 construct the array in the X-Y plane in each portion.

The upper line 11 and the lower line 12 both extend in the X direction, and a plurality of MTJ elements 10 arranged in the X direction are arranged between both the lines 11 and 12. The selective transistor 14 is connected to one end of the upper line 11. The peripheral circuit such as the sense amplifier (S/A) 15 is connected to one end of the lower line 12.

The upper line 11 and the lower line 12 each function as a read line. In other words, the read current flows in the path from the upper line 11 through the MTJ elements 10 to the lower line 12, that is along the X direction during data reading.

The write lines 13 are arranged above the MTJ elements 10 and extend in the Y direction in each portion of the array of the MTJ elements 10. Further, the write lines 13 are arranged in the vicinity of the free layers of the MTJ elements 10. Moreover, when a group of a plurality of MTJ elements arranged in the X direction is assumed to be one column and a group of a plurality of MTJ elements arranged in the Y direction is assumed to be one row, in the present embodiment, the write lines 13 arranged in each portion are connected in serial in one row of the array of the MTJ elements 10.

Figure 11:
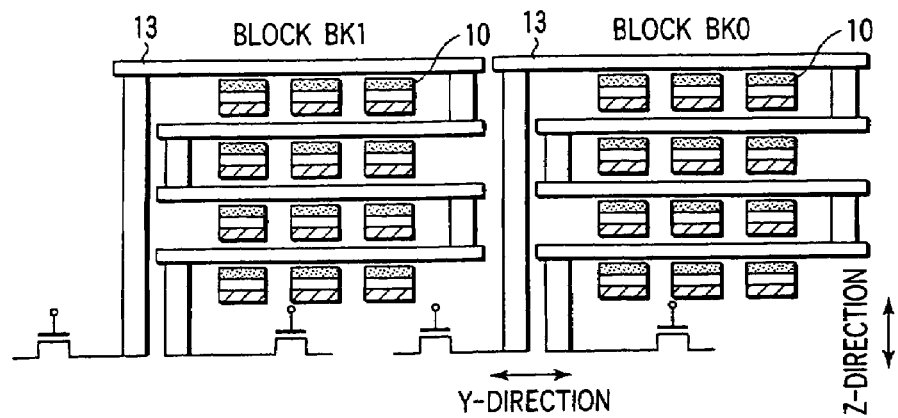
FIG. 11 is a section view along the Y direction of a structure of FIG. 10.

More specifically, as shown in FIG. 11, the write line 13 in the upper portion and the write line 13 in the lower portion are electrically connected to each other via the contact plugs at the end of the array of the MTJ elements 10. In FIG. 11, the upper lines and the lower lines are omitted for simplicity.

In the present embodiment, the number of accumulated portions of the MTJ elements 10 is four. That is, when the number of accumulated portions of the MTJ elements 10 is even number (2, 4, 6, . . . portions), two contact sections for connecting the write lines 13 and the transistors are both arranged at one end of the array section of the MTJ elements 10 as shown in FIG. 11.

In this case, for example, as shown in FIG. 11, the transistor connected to one end of the write line 13 in the block BK0 is arranged immediately below the array of the block BK1 adjacent to the block BK0, and the transistor connected to the other end of the write line 13 in the block BK0 is arranged immediately below the array of the block BK0.

As with the aforementioned first embodiment, when the number of accumulated portions of the MTJ elements 10 is odd number (3, 5, 7, . . . portions), as shown in FIG. 9, the contact section for connecting one end of the write line 13 and the transistor is arranged at one end of the array section of the MTJ elements 10. The contact section for connecting the other end of the write line 13 and the transistor is arranged at the other end opposite to the one end of the array section of the MTJ elements 10.

Therefore, in this case, for example, as shown in FIG. 9, the transistors connected to one end and the other end of the write line 13 in the block BK0 are arranged immediately below the array of the block BK0, respectively.

As described above, in the present embodiment, the lines having the same function arranged in each portion, that is the write lines are connected in serial in one row of the array of the MTJ elements 10 so that the transistors may be arranged by one transistor at both ends of the write line. Therefore, the number of transistors arranged at the end of the array of the MTJ elements 10 can be remarkably reduced.

Further, according to such a device structure, the transistor may be connected to the line connected in serial in one row of the array of the MTJ elements 10 irrespective of the number of accumulated portions of the MTJ elements. Therefore, even when the number of accumulated portions of the MTJ elements 10 is increased so that the increase in the memory capacity is achieved, the number of transistors is not increased and the layout thereof does not become complicated.

Moreover, since the number of transistors connected to the write lines 13 arranged in each portion in one row of the array of the MTJ elements 10 is always constant, assuming that the array of the MTJ elements 10 is one small block, a large memory cell array may be constructed by a plurality of blocks. In this case, for example, as shown in FIG. 11, the core circuits such as the transistors or sense amplifiers may be arranged immediately below the MTJ elements 10 in each block.

③ Third Embodiment

Figure 12:
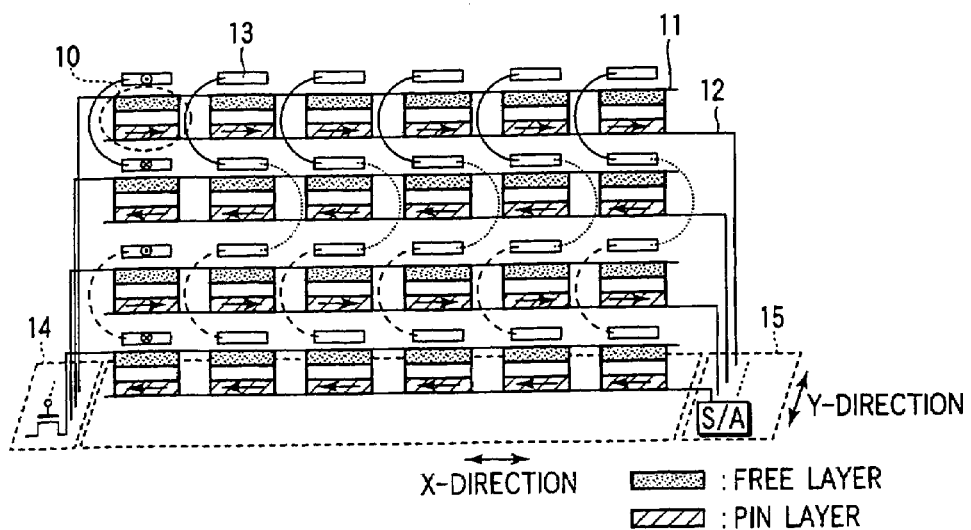
FIG. 12 is a section view showing a third embodiment of the invention relating to the serial/parallel connection wiring.

FIG. 12 shows a cell array section of a magnetic random access memory according to a third embodiment of the present invention.

The magnetic random access memory according to the present embodiment is characterized in that the orientation of magnetization of the pin layers of the MTJ elements 10 of FIG. 10 is changed every portion, and other points are same as the magnetic random access memory of FIG. 10.

A plurality of MTJ elements 10 are accumulated in a plurality of portions (in the present embodiment, four portions) on the semiconductor substrate. Further, the MTJ elements 10 construct the array in the X-Y plane in each portion.

The upper line 11 and the lower line 12 both extend in the X direction, and a plurality of MTJ elements 10 arranged in the X direction are arranged between both the lines 11 and 12. The selective transistor 14 is connected to one end of the upper line 11. Further, the peripheral circuit such as the sense amplifier (S/A) 15 is connected to one end of the lower line 12.

The upper line 11 and the lower line 12 each function as a read line. In other words, the read current flows in the path from the upper line 11 through the MTJ elements 10 to the lower line 12, that is along the X direction during data reading.

The write lines 13 are arranged above the MTJ elements 10 and extend in the Y direction in each portion of the array of the MTJ elements 10. Further, the write lines 13 are arranged in the vicinity of the free layers of the TMT elements 10. Moreover, when a group of a plurality of MTJ elements arranged in the X direction is assumed to be one column and a group of a plurality of MTJ elements arranged in the Y direction is assumed to be one row, in the present embodiment, the write lines 13 arranged in each portion are connected in serial in one row of the array of the MTJ elements 10.

That is, as shown in FIG. 11, the write line 13 in the upper portion and the write line 13 in the lower portion are electrically connected to each other via the contact plugs at the end of the array of the MTJ elements 10.

In the aforementioned second embodiment, the write lines 13 are arranged in a meandering manner in the Y-Z plane as clear from FIG. 11. In this case, as shown in FIG. 12, when the current in one direction is flowed through the write lines 13, the orientation of the current flowing through the write lines 13 in each portion is reverse every portion.

In the case of FIG. 12, the write current directing from recto to verso flows through the write lines at the odd portions, that is the write lines 13 at the first portion nearest to the semiconductor substrate and the write lines 13 at the third portion, and the write current directing from verso to recto flows through the write lines 13 in the even portions, that is the write lines in the second and fourth portions.

In such a situation, for example, assuming that the orientations of the magnetization of the pin layers of all the MTJ elements 10 are same, for example, when the same data is written into the MTJ elements in the odd portions and the MTJ elements in the even portions, the write current in a different direction has to be flowed through the write lines 13.

In other words, in the case where the orientations of the magnetization of the pin layers of all the MTJ elements 10 are same and the orientation of the write current of the lower lines 12 is constant, when only the write current in one direction is flowed through the write lines 13, the orientation of the magnetization of the free layers of the MTJ elements 10 in each portion is reverse every portion. That is, the magnetization state of the MTJ elements 10 in each portion is parallel or anti-parallel every portion so that different data is written into the MTJ elements 10 in each portion in spite of the same operation.

As described above, in the second embodiment, when the current in one direction is flowed through the write lines 13, the orientation of the current flowing through the write lines 13 is reverse to each other every portion so that a method of controlling the write operation may be complicated.

In the present embodiment, in order to solve such a problem, as shown in FIG. 12, it is proposed that the orientation of the magnetization of the pin layers of the MTJ elements 10 is changed every portion. In this case, when only the write current in one direction is flowed through the write lines 13, the orientation of the magnetization of the free layers of the MTJ elements 10 in each portion is reverse every portion, but the magnetization state of the MTJ elements 10 in each portion is same (parallel or anti-parallel) by each portion. That is, the same data is written into the MTJ elements 10 in each portion.

The orientation of the magnetization of the pin layers of the MTJ elements 10 can be easily changed every portion according to a conventional process. In other words, in order to change the orientation of the magnetization of the pin layers of the MTJ elements 10 every portion, the orientation of the magnetic fields only has to be adjusted when materials constructing the pin layers are deposited.

In the present embodiment, the problem that the write lines 13 are arranged in the meandering manner is solved by changing the orientation of the magnetization of the pin layers of the MTJ elements 10 every portion, but there are some solving methods other than this method.

For example, as described above, the current in a different direction may be flowed through the write lines 13 or the orientation of the write current flowed through the lower lines 12 may be changed though the write control is complicated. Further, it is permitted that the same data is saved in a different magnetization state in each portion so that the condition of data determination may be changed every portion.

As described above, in the present embodiment, the orientation of the magnetization of the pin layers of the MTJ elements is changed every portion. In this case, when only the write current in one direction is flowed through the write lines, the orientation of the magnetization of the free layers of the MTJ elements in each portion is reverse every portion, but the magnetization state of the MTJ elements in each portion is same (parallel or anti-parallel) by each portion.

Therefore, according to the present embodiment, the same effect as the magnetic random access memory according to the aforementioned second embodiment can be obtained and the method of controlling the write operation does not become complicated.

④ Fourth Embodiment

Figure 13:
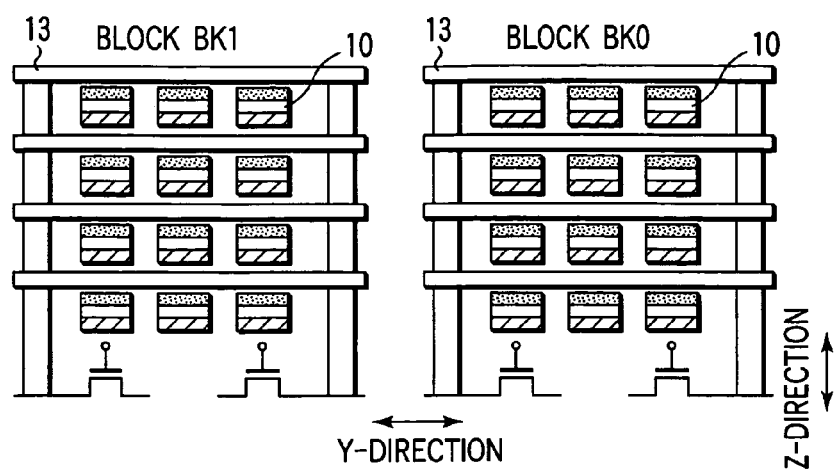
FIG. 13 is a section view showing a fourth embodiment of the invention relating to the serial/parallel connection wiring.

FIG. 13 shows an outline of a cell array section of a magnetic random access memory according to a fourth embodiment of the present invention. In FIG. 13, the upper lines and the lower lines connected to the MTJ elements are omitted for simplicity.

The magnetic random access memory according to the present embodiment is characterized in that the write lines 13 arranged in each portion of the MTJ elements 10 of FIG. 11 are connected not in serial but in parallel as compared with the magnetic random access memory of FIG. 11, and other points are same as the magnetic random access memory of FIG. 11.

A plurality of MTJ elements 10 are accumulated in a plurality of portions (in the present embodiment, four portions) on the semiconductor substrate. Further, the MTJ elements 10 construct the array in the X-Y plane in each portion.

Also in the present embodiment, as shown in FIG. 10, the upper line 11 and the lower line 12 both extend in the X direction, and a plurality of MTJ elements 10 arranged in the X direction are arranged between both the lines 11 and 12. The selective transistor 14 is connected to one end of the upper line 11. Further, the peripheral circuit such as the sense amplifier (S/A) 15 is connected to one end of the lower line 12.

As shown in FIG. 13, the write lines 13 are arranged above the MTJ elements 10 and extend in the Y direction in each portion of the array of the MTJ elements 10. Further, the write lines 13 are arranged in the vicinity of the free layers of the MTJ elements 10. Moreover, when a group of a plurality of MTJ elements arranged in the X direction is assumed to be one column and a group of a plurality of MTJ elements arranged in the Y direction is assumed to be one row, in the present embodiment, the write lines 13 arranged in each portion are connected in parallel in one row of the array of the MTJ elements 10.

In other words, the write line 13 in the upper portion and the write line 13 in the lower portion are electrically connected to each other via the contact plugs at the end of the array of the MTJ elements 10.

In the aforementioned second embodiment, the write lines 13 in each portion are connected in serial to each other so that the write lines 13 are arranged in the meandering manner in the Y-Z plane as clear from FIG. 11. On the contrary, in the present embodiment, the write lines 13 in each portion are connected in parallel to each other so that the write lines are arranged in a ladder shape in the Y-Z plane as clear from FIG. 13.

In the present embodiment, when the current in one direction is flowed through the write lines 13, the orientations of the current flowing through the write lines 13 in the respective portions are identical to each other unlike the second embodiment.

Therefore, according to the present embodiment, the same effect as the magnetic random access memory according to the aforementioned second embodiment can be obtained, and the write operation can be easily controlled even when the measures that the orientation of the magnetization of the pin layers of the MTJ elements is changed every portion are not taken as with the aforementioned third embodiment.

Further, in the present embodiment, since the write lines in each portion are connected in parallel, the contact sections between the write lines and the transistors are arranged by one contact section at two ends opposite to each other of the array of the MTJ elements. Therefore, assuming that the array of the MTJ elements is one small block, a large memory cell array may be configured with a plurality of blocks. In this case, the core circuits such as the transistors or sense amplifiers may be arranged immediately below the MTJ elements in each block.

⑤ Fifth Embodiment

Figure 14:
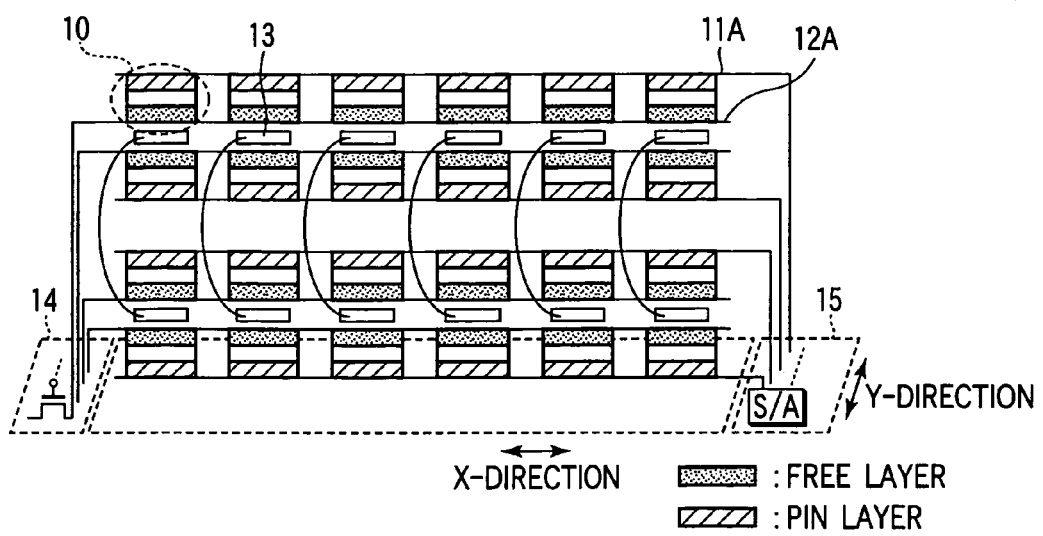
FIG. 14 is a section view showing a fifth embodiment of the invention relating to the serial/parallel connection wiring.
Figure 15:
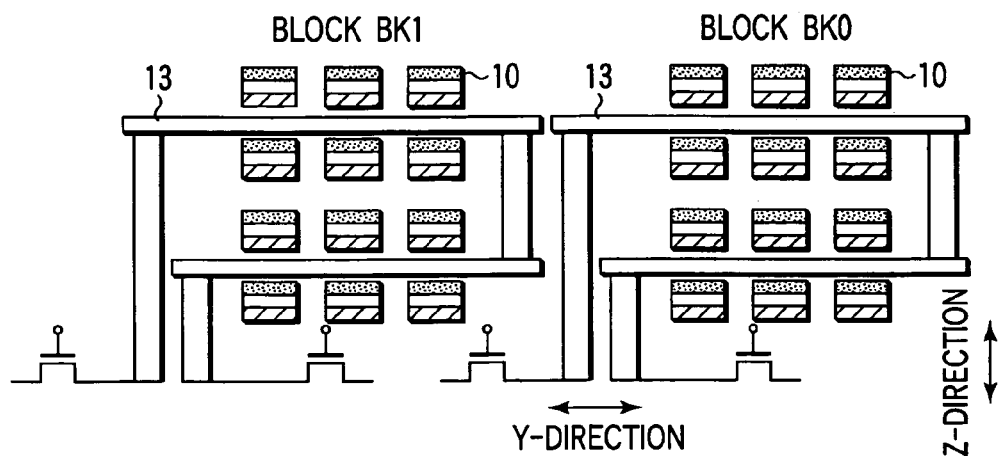
FIG. 15 is a section view along the Y direction of a structure of FIG. 14.

FIG. 14 shows a cell array section of a magnetic random access memory according to a fifth embodiment of the present invention. FIG. 15 shows a section along the Y direction of the cell array section of FIG. 14.

The fifth embodiment is an example in combination with the aforementioned first embodiment and the "sharing of wiring".

A plurality of MTJ elements 10 are accumulated in a plurality of portions (in the present embodiment, four portions) on the semiconductor substrate. Further, the MTJ elements 10 construct the array in the X-Y plane in each portion.

The write line 13 is arranged between two MTJ elements 10 adjacent in the vertical direction, and extends in the Y direction. In the present embodiment, the write line 13 is shared with two MTJ elements adjacent in the vertical direction. In other words, the write lines 13 are not arranged between all the portions, but are arranged, for example, immediately above the MTJ elements 10 in the odd portions and immediately below the MTJ elements 10 in the even portions from the semiconductor substrate side.

Further, when a group of a plurality of MTJ elements arranged in the X direction is assumed to be one column and a group of a plurality of MTJ elements arranged in the Y direction is assumed to be one row, in the present embodiment, the write lines 13 arranged in each portion are connected in serial in one row of the array of the MTJ elements 10.

In addition, two MTJ elements above and below the write line 13 are arranged symmetric to each other relative to the write line 13. That is, the pin layer in which the orientation of the spin is pinned of the two magnetic layers of the MTJ element 10 is arranged far away from the write line 13. Moreover, the free layer in which the orientation of the spin can be freely changed of the two magnetic layers of the MTJ element 10 is arranged near the write line 13. The write line 13 is positioned equidistantly from the two MTJ elements 10 above and below the write line 13 and is separated from the two MTJ elements 10.

In each portion, the first conductive line 11A functioning as a read line is connected to the pin layer of the MTJ element 10. The conductive line 11A extends in the X direction, and is commonly connected to the pin layers of a plurality of MTJ elements 10 arranged in the X direction. The sense amplifier (S/A) 15 is connected to one end of the first conductive line 11A.

Further, in each portion, the second conductive line 12A functioning as a write line and read line is connected to the free layer of the MTJ element 10. The second conductive line 12A extends in the X direction, and is commonly connected to the free layers of a plurality of MTJ elements 10 arranged in the X direction. The switching element 14 functioning as a selective transistor is connected to one end of the second conductive line 12A.

According to such a cell structure of the fifth embodiment, the same effect as the first embodiment can be obtained and the effect with respect to the aforementioned "sharing of wiring" can be obtained.

⑥ Sixth Embodiment

Figure 16:
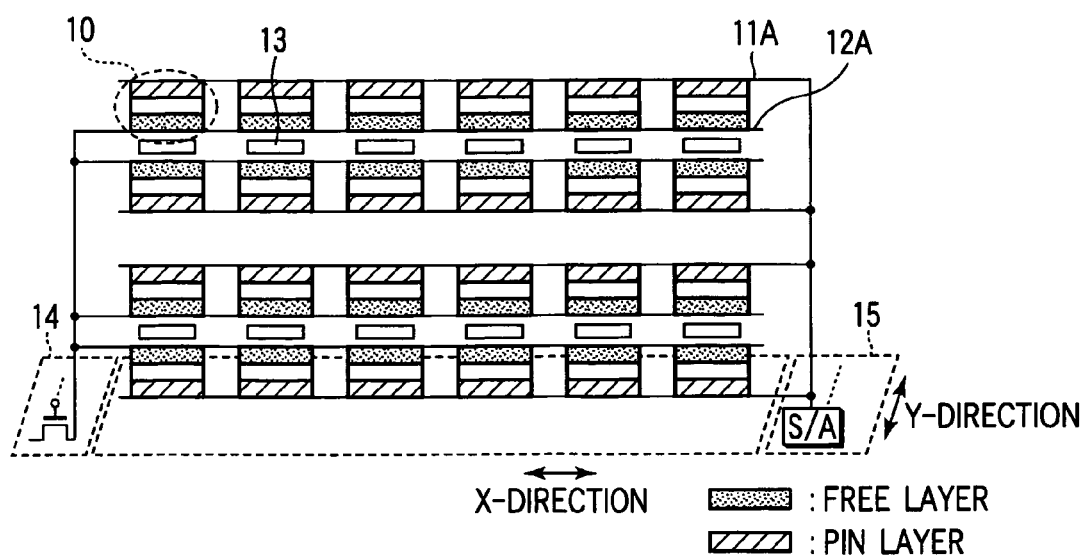
FIG. 16 is a section view showing a sixth embodiment of the invention relating to the serial/parallel connection wiring.

FIG. 16 shows a cell array section of a magnetic random access memory according to a sixth embodiment of the present invention.

The sixth embodiment is an example in which a plurality of MTJ elements accumulated in a plurality of portions present in one column are collectively connected to one sense amplifier.

A plurality of MTJ elements 10 are accumulated in a plurality of portions (in the present embodiment, four portions) on the semiconductor substrate. Further, the MTJ elements 10 construct the array in the X-Y plane in each portion.

The write line 13 is arranged between two MTJ elements 10 adjacent in the vertical direction, and extends in the Y direction. In the present embodiment, the write line 13 is shared with two MTJ elements adjacent in the vertical direction. In other words, the write lines 13 are not arranged between all the portions, are arranged, for example, immediately above the MTJ elements 10 in the odd portions and immediately below the MTJ elements 10 in the even portions from the semiconductor substrate side.

Further, two MTJ elements present above and below the write line 13 are arranged symmetric to each other relative to the write line 13. That is, the pin layer in which the orientation of the spin is pinned of the two magnetic layers of the MTJ element 10 is arranged far away from the write line 13. In addition, the free layer in which the orientation of the spin can be freely changed of the two magnetic layers of the MTJ element 10 is arranged near the write line 13. The write line 13 is positioned equidistantly from the two MTJ elements 10 present above and below the write line 13, and is separated from the two MTJ elements 10.

In each portion, the first conductive line 11A functioning as a read line is connected to the pin layer of the MTJ element 10. The first conductive line 11A extends in the X direction, and is commonly connected to the pin layers of a plurality of MTJ elements 10 arranged in the X direction.

In the present embodiment, when a group of a plurality of MTJ elements arranged in the X direction is assumed to be one column, in one column of the array of the MTJ elements 10, one ends of the first conductive lines 11A arranged in each portion are commonly connected. The commonly connected first conductive lines 11A are connected to the sense amplifier (S/A) 15.

Further, in each portion, the second conductive line 12A functioning as a write line and read line is connected to the free layer of the MTJ element 10. The second conductive line 12A extends in the X direction, and is commonly connected to the free layers of a plurality of MTJ elements 10 arranged in the X direction.

In the present embodiment, in one column of the array of the MTJ elements 10, the second conductive lines 12A arranged in each portion are commonly connected at one ends thereof. The second conductive lines 12A are connected to the switching element 14 functioning as a selective transistor.

As described above, in the cell structure according to the sixth embodiment, one ends of the first conductive lines 11A are commonly connected and the connecting points thereof are connected to one sense amplifier S/A. Further, one ends of the second conductive lines 12A are commonly connected, and the connecting points thereof are connected to one switching element 14.

Also in such a structure, the same effect as the first embodiment, for example, the effect that the number of transistors arranged on the periphery of the memory cell array is decreased can be obtained. Further, in the present embodiment, the effect with respect to the aforementioned "sharing of wiring" can be obtained.

(4) Others

In the first to fifth embodiments, there is described a case where the write lines (write-only lines) arranged in each portion in one row are connected in serial or in parallel in the array structure in which the MTJ elements are accumulated in a plurality of portions. However, the present invention can be applied to the lines arranged in the array of the MTJ elements other than the write lines.

For example, as with the sixth embodiment, the present invention can be applied to the upper lines 11 and the lower lines 12 in FIG. 1, and the upper lines 11 and the lower lines 12 in FIG. 2, respectively.

Further, in the first to fourth embodiments, the lines arranged in each portion of the MTJ elements accumulated in a plurality of portions are described by way of example. But, for example, in the case where the line is shared with the upper and lower MTJ elements, the lines having the same function are arranged not in each portion but every other portion.

Also in such a case, as shown in the fifth embodiment, the lines arranged every other portion can be connected in serial or in parallel to construct the present invention.

Furthermore, in the first to fourth embodiments, the transistors connected to the lines in the array of the MTJ elements are generally MOS transistors, but may be bipolar transistors, diodes, or the like.

In the present invention, the magnetic random access memory having an array structure in which the MTJ elements are accumulated in a plurality of portions can be applied to any devices having any structure.

(5) Conclusion

Hereinbefore, as described above, according to the magnetic random access memory of the embodiments of the present invention, the conductive lines having the same function arranged in each portion are connected in serial or in parallel in the array structure in which the MTJ elements are accumulated in a plurality of portions. Accordingly, the transistors may be arranged by one transistor at one ends or both ends of the conductive lines so that it is possible to decrease the number of transistors arranged at the end of the array of the MTJ elements.

Further, the transistors may be connected to the conductive lines connected in serial or in parallel in one row or column of the array of the MTJ elements irrespective of the number of accumulated portions of the MTJ elements. Therefore, even when the number of accumulated portions of the MTJ elements is increased so that the increase in the memory capacity is achieved, the number of transistors is not increased and the layout thereof does not become complicated.

Moreover, since the number of transistors connected to the conductive lines arranged in one column of the array of the MTJ elements is constant, assuming that the array of the MTJ elements is one small block, a large memory cell array may be constructed by a plurality of blocks. In this case, the core circuits such as the transistors or sense amplifiers may be arranged immediately below the MTJ elements.

3. Three-Dimensional Wiring (1) Presupposed Technique

Figure 17:
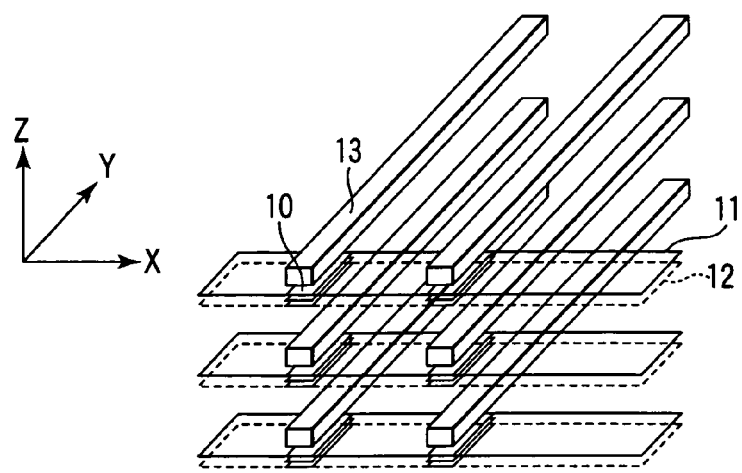
FIG. 17 is a perspective view showing a reference example of the invention relating to a three-dimensional wiring.
Figure 18:
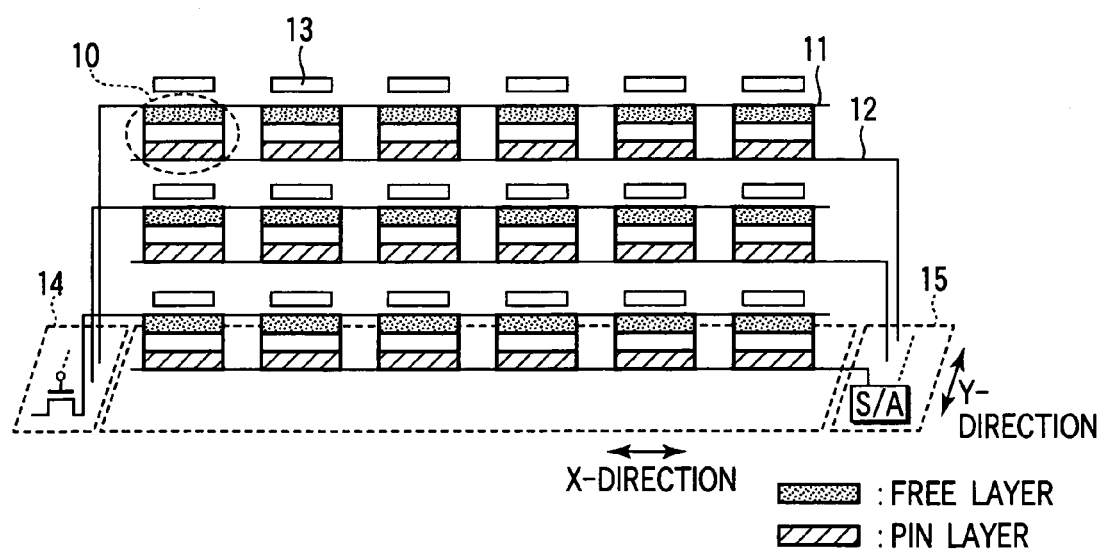
FIG. 18 is a section view showing the reference example of the invention relating to the three-dimensional wiring.

FIGS. 17 and 18 show a presupposed technique of a magnetic random access memory according to embodiments of the present invention.

A plurality of MTJ elements 10 are accumulated in a plurality of portions (in the present embodiment, three portions) on the semiconductor substrate. Further, in each portion, a plurality of MTJ elements 10 are connected in parallel between the upper line 11 and the lower line 12.

The upper line 11 extends in the X direction, and one end thereof is connected to the selective transistor 14. The lower line 12 also extends in the X direction, and one end thereof is connected to the peripheral circuit such as the sense amplifier (S/A) 15. In the present embodiment, the read current flows in the path from the upper line 11 through the MTJ elements 10 to the lower line 12, that is along the X direction. The write lines 13 are arranged adjacent to the MTJ elements 10, and extend in the Y direction.

Figure 19:
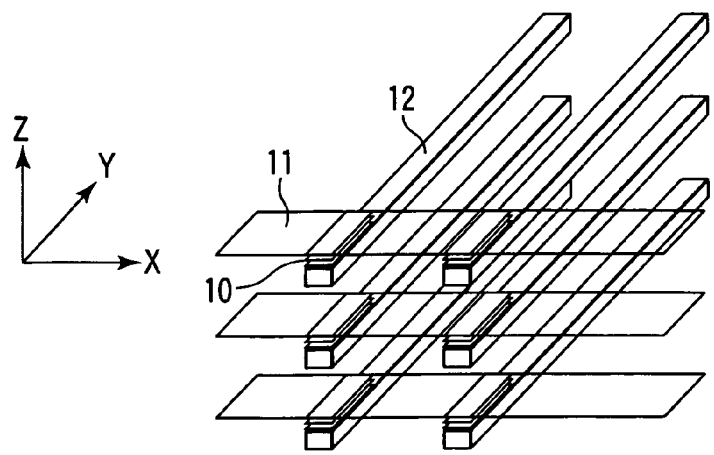
FIG. 19 is a perspective view showing the reference example of the invention relating to the three-dimensional wiring.
Figure 20:
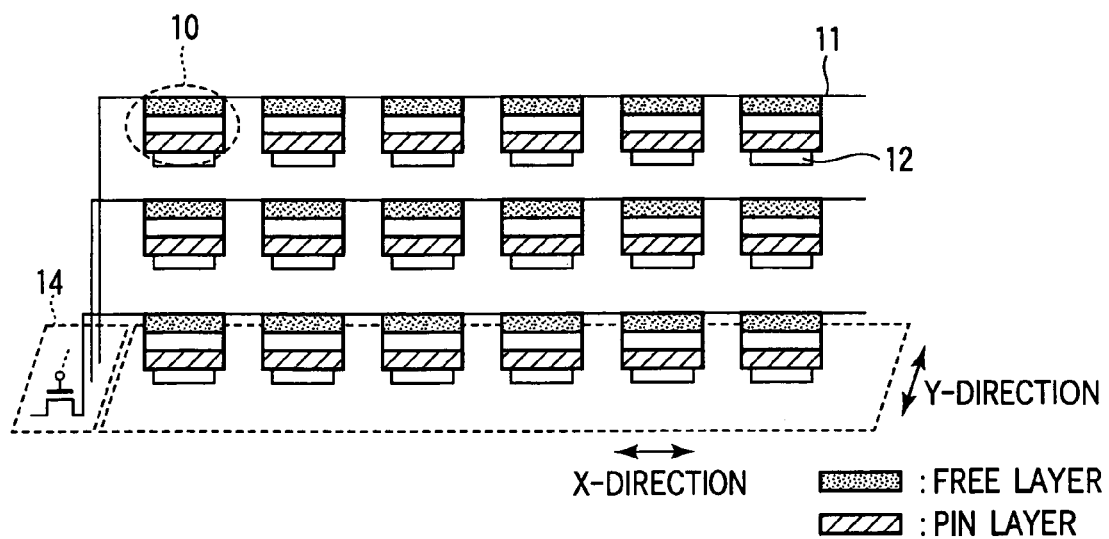
FIG. 20 is a section view showing the reference example of the invention relating to the three-dimensional wiring.

FIGS. 19 and 20 show an example in which the lower line and the write line are integrated in the cell structure in FIGS. 17 and 18.

The lower line 12 extends in the Y direction, and one end thereof is connected to the sense amplifiers (S/A). The lower line 12 functions as a write line during writing. The lower line 12 functions as a read line during reading. The read current flows through the upper line (X direction) 11 at first, and then flows through the MTJ elements 10 to the lower line (Y direction) 12.

A basic structure of the magnetic random access memory is a 1 cell-1 transistor structure in which one switching element (selective transistor) is corresponded to one MTJ element. However, in the device structure in which the MTJ elements are accumulated in a plurality of portions, when one switching element is corresponded to one MTJ element, the number of switching elements is increased, which is disadvantageous for the high density of the cells.

In the case of the device structure in which the MTJ elements 10 are accumulated in a plurality of portions, there is employed the device structure in which read operation or write operation can be performed even when one switching element is not corresponded to one MTJ element.

For example, in the device structure shown in FIGS. 17 to 20, in each portion of the array of the MTJ elements 10, a plurality of MTJ elements 10 are connected between the upper line 11 and the lower line 12. For example, the selective transistor 14 is connected to one end of the upper line 11, and the sense amplifier (S/A) 15 is connected to one end of the lower line 12.

However, in this case, in the example of FIGS. 17 and 18, three lines of the upper line (read/write line) 11, the lower line (read line) 12 and the write line 13 in total have to be arranged in each portion of the array of the MTJ elements 10. Further, in the example in FIGS. 19 and 20, two lines of the upper line (read/write line) 11 and the lower line (read/write line) 12 in total have to be arranged in each portion of the array of the MTJ elements 10.

When such a write line or read line (current path line) is arranged in the array of the MTJ elements accumulated in a plurality of portions on the substrate, when the number of accumulated portions of the MTJ elements becomes larger, the device structure becomes complicated so that the following problems occur.

a. The characteristics of the MTJ elements are largely influenced by the flatness of the surfaces (base films) on which the MTJ elements are arranged. Since this flatness is deteriorated when the number of accumulated portions of the MTJ elements becomes larger, deterioration of the characteristics of the MTJ elements occurs along with the increase in the number of accumulated portions of the MTJ elements.

b. When the data write/read operation for the MTJ element is performed using three or more lines (for example, FIGS. 17 and 18), one read line and one write line have to be insulated from each other and the read line has to be in contact with the MTJ element. In other words, one write line is extra separated from the MTJ element by the thickness of one read line.

It is a well-known fact that the intensity of the magnetic field generated by the current flowed through the write line is inversely proportional to square of the distance. Therefore, as described above, when three or more lines are used, the distance between one write line and the MTJ element becomes larger, and the variations thereof are also increased. That is, the variations of the magnetic field given to the MTJ element by the current flowed through the write line are increased so that sufficient margin has to be secured with respect to the magnetic field required for writing.

c. The transistors are connected to the respective ends of the conductive lines arranged in each portion of the array of the MTJ elements. Further, the conductive lines extend in the X direction or the Y direction on the array of the MTJ elements. Therefore, the transistors connected to the conductive lines are intensively arranged in the areas at the end of the array (or on the periphery of the array) (refer to FIG. 6).

On the other hand, in the data write/read operation for the MTJ elements, it is known that a large current is required due to the characteristics of the MTJ elements. Therefore, the size (or pitch) of the transistors connected to the lines inevitably becomes larger.

Accordingly, when the number of accumulated portions of the MTJ elements is increased, the number of transistors which have to be arranged in one row or column is increased in proportion thereto. Consequently, all the transistor cannot be arranged at the periphery of the array, or the pitch of the MTJ elements is influenced by the pitch of the transistors so that high integration of the MTJ elements cannot be achieved.

(2) Outline

The embodiments of the present invention (three-dimensional wiring) are applied to a magnetic random access memory having an array structure in which the MTJ elements are accumulated in a plurality of portions.

The magnetic random access memory according to the embodiments of the present invention is characterized in that a plurality of lines used for data writing/reading are three-dimensionally arranged in the array of the MTJ elements.

In other words, conventionally, all the lines used for the data writing/reading extend in the X direction or the Y direction. On the contrary, in the magnetic random access memory according to the embodiments of the present invention, assuming that the direction in which the MTJ elements are accumulated in a plurality of portions is the Z-axis direction, when the MTJ elements construct the array in the X-Y axis directions in each portion, at least one of a plurality of conductive lines used for the data writing/reading is extended in the Z-axis direction.

As described above, the conductive lines used for the data writing/reading are three-dimensionally arranged so that the number of conductive lines extending in the X-Y axis directions can be decreased. The conductive lines extending in the Z-axis direction can be easily formed by, for example, a contact process. From the above, even when the number of accumulated portions of the MTJ elements is increased, it is possible to realize improvement of the flatness of the base films and improvement of the characteristics of the MTJ elements.

Further, when the conductive lines used for the data writing/reading are three-dimensionally arranged, the degree of freedom of the layout of the conductive lines in the array is increased so that, for example, two write lines can be arranged in the vicinity of the MTJ elements and the variations of the magnetic fields given to the MTJ elements can be restricted.

Moreover, one end of the conductive line extending in the Z-axis direction is present immediately below the array of the MTJ elements. Therefore, the transistor connected to the conductive line can be easily formed immediately below the array so that the transistors are not concentrated on the periphery of the array.

(3) Embodiments

① First Embodiment

FIG. 21 shows a layout of a cell array section of a magnetic random access memory according to a first embodiment of the present invention.

A plurality of MTJ elements 10 are accumulated in a plurality of portions (in the present embodiment, three portions) on the semiconductor substrate. Further, the MTJ elements 10 construct the array in the X-Y plane in each portion.

The upper line 11 functions as a read line, and extends in the X direction. The upper line 11 is in contact with, for example, the free layers of the MTJ elements 10. The lower line 12 functions as a read line and write line, and extends in the Y direction. The lower line 12 is in contact with, for example, the pin layers of the MTJ elements 10. Further, for example the selective transistor is connected to one end of the upper line 11, and the sense amplifier (S/A) is connected to one end of the lower line 12.

The write line 13 extends in the Z-axis direction, and is arranged in the vicinity of a plurality of MTJ elements 10 accumulated in the Z-axis direction. The data to be written in the MTJ element 10 (the orientation of the magnetization of the free layer) is determined by the synthetic magnetic field of the magnetic field generated by the current flowing through the lower line 12 in the Y-axis direction and the magnetic field generated by the current flowing through the write line 13 in the Z-axis direction.

The selective transistor (for example, MOS transistor) 14 is connected to one end of the write line 13 at the substrate side. This selective transistor 14 is arranged immediately below the array of the MTJ elements 10.

According to such a device structure, at least one (in the present embodiment, the write line 13) of a plurality of conductive lines used for the data writing/reading is extended in the Z-axis direction.

For example, with respect to a case where writing/reading is performed using three conductive lines, conventionally, since all the three conductive lines extend in the X-axis direction or the Y-axis direction, at least three multilayer wiring processes are required for one portion of the array of the MTJ elements. On the contrary, in the example of the present invention, the conductive line extending in the Z-axis direction can be formed by the contact process so that it is possible to decrease the number of multilayer wiring processes per portion of the array of the MTJ elements.

Thereby, even when the number of accumulated portions of the MTJ elements is increased, the improvement of the flatness of the base films and the improvement of the characteristics of the MTJ elements can be realized.

Further, when the conductive lines used for the data writing/reading are three-dimensionally arranged, the degree of freedom of the layout of the lines in the array is increased.

For example, with respect to a case where writing/reading is performed using three lines, conventionally, there is employed a structure where the read line is arranged between the write-only conductive line and the MTJ element so that the distance between the write-only conductive line and the MTJ element becomes larger. On the contrary, in the example of the present invention, for example, the write-only conductive line is extended in the Z-axis direction. In this way, this write-only conductive line can be arranged in the vicinity of the MTJ element so that the variations of the magnetic field given to the MTJ element can be restricted.

In addition, one end of the write line extending in the Z-axis direction is present immediately below the array of the MTJ elements. Therefore, the transistor connected to the conductive line can be easily formed immediately below the array so that concentration of the transistors on the periphery of the array can be alleviated.

In the present embodiment, a device structure is employed in which three types of conductive lines are arranged in the array of the MTJ elements and the respective lines are orthogonal to each other and extend in the different directions from each other. By doing so, the transistors connected to the respective lines can be arranged in a dispersed manner on the substrate.

In the present invention, it is enough that at least one conductive line extending in the Z direction is present. When a plurality of conductive lines other than this line are provided, they may extend in the same direction or in the different directions from each other.

② Second Embodiment

In the aforementioned first embodiment, there is described the case where the three types of conductive lines are arranged in the array of the MTJ elements, but the present invention can be applied to a case where only two types of conductive lines having the function as a read/write line are arranged in the array of the MTJ elements.

FIG. 22 shows a layout of a cell array section of a magnetic random access memory according to a second embodiment of the present invention.

A plurality of MTJ elements 10 are accumulated in a plurality of portions (in the present embodiment, three portions) on the semiconductor substrate. Further, the MTJ elements 10 construct the array in the X-Y plane in each portion.

Conductive patterns 11C are formed on the MTJ elements 10. The conductive line 13 functioning as a write line and read line (current path line) extends in the Z-axis direction, and is arranged in the vicinity of a plurality of MTJ elements 10 accumulated in the Z-axis direction. Further, the conductive line 13 is connected to the conductive patterns 11C of a plurality of MTJ elements 10 accumulated in the Z-axis direction.

The selective transistor (for example, MOS transistor) 14 is connected to one end of the conductive line 13 at the substrate side. This selective transistor 14 is arranged immediately below the array of the MTJ elements 10.

The lower line 12 functions as a write line and read line (current path line), and extends in the Y direction. The lower line 12 is in contact with, for example, the pin layers of the MTJ elements 10. Further, for example, the sense amplifier (S/A) is connected to one end of the lower line 12.

The data to be written in the MTJ element 10 (the orientation of the magnetization of the free layer) is determined by the synthetic magnetic field of the magnetic field generated by the current flowing through the lower line 12 in the Y-axis direction and the magnetic field generated by the current flowing through the write line 13 in the Z-axis direction.

According to such a device structure, at least one (in the present embodiment, the conductive line 13) of a plurality of conductive lines used for the data writing/reading is extended in the Z-axis direction. The conductive line extending in the Z-axis direction can be formed by the contact process so that it is possible to decrease the number of multilayer wiring processes per portion of the array of the MTJ elements.

In the present embodiment, in each portion of the array of the MTJ elements, only one conductive line extends in the X direction or the Y direction so that the improvement of the flatness of the base films and the improvement of the characteristics of the MTJ elements can be further achieved.

Further, when the conductive lines used for the data writing/reading are three-dimensionally arranged, the degree of freedom of the layout of the conductive lines in the array can be increased and the variations of the magnetic fields given to the MTJ elements can be restricted.

Furthermore, one end of the write line extending in the Z-axis direction is arranged immediately below the array of the MTJ elements. In other words, the transistor connected to the conductive line is arranged immediately below the array of the MTJ elements so that the concentration of the transistors on the periphery of the array can be alleviated.

③ Third Embodiment

The present embodiment is a modified example of the magnetic random access memory according to the aforementioned first embodiment.

In the aforementioned first embodiment, in one portion of the array of the MTJ elements, one write line is corresponded to one MTJ element. However, in the present embodiment, in one portion of the array of the MTJ elements, a configuration is employed in which one write line is corresponded to two MTJ elements adjacent in the X direction. In other words, in one portion of the array of the MTJ elements, one write line is sandwiched by the two MTJ elements.

Such a structure makes it possible to reduce the number of write lines extending in the Z-axis direction to half the number required for the aforementioned first embodiment so that high density of the MTJ elements can be accordingly realized.

FIG. 23 shows a layout of a cell array section of a magnetic random access memory according to a third embodiment of the present invention.

A plurality of MTJ elements 10 are accumulated in a plurality of portions (in the embodiment, three portions) on the semiconductor substrate. Further, the MTJ elements 10 construct the array in the X-Y plane in each portion.

The upper line 11 functions as a read line, and extends in the X direction. The upper line 11 is in contact with, for example, the free layers of the MTJ elements 10. The lower line 12 functions as a write line and read line, and extends in the Y direction. The lower line 12 is in contact with, for example, the pin layers of the MTJ elements 10. Further, for example, the selective transistor is connected to one end of the upper line 11, and the sense amplifier (S/A) is connected to one end of the lower line 12.

The write line 13 extends in the Z-axis direction, and is arranged in the vicinity of a plurality of MTJ elements 10 accumulated in the Z-axis direction.

Further, in the present embodiment, in one portion of the array of the MTJ elements 10, one write line 13 is corresponded to two MTJ elements adjacent in the X direction. In other words, in one portion of the array of the MTJ elements, one write line 13 is sandwiched by the two MTJ elements.

With such a structure, the number of write lines 13 extending in the Z-axis direction can be decreased so that the high density of the MTJ elements can be accordingly realized.

The selective transistor (for example, MOS transistor) 14 is connected to one end of the write line 13 at the substrate side. The selective transistor 14 is arranged immediately below the array of the MTJ elements 10.

The data to be written in the MTJ element 10 (the orientation of the magnetization of the free layer) is determined by the synthetic magnetic field of the magnetic field generated by the current flowing through the lower line 12 in the Y-axis direction and the magnetic field generated by the current flowing through the write line 13 in the Z-axis direction.

Figure 26:
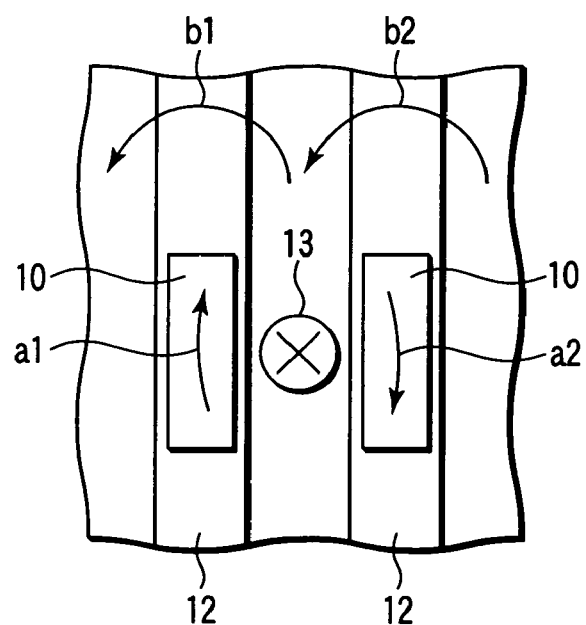
FIG. 26 is a plan view showing a positional relationship between a write line and MTJ elements.

Here, in the present embodiment, when the current in one direction is flowed through the write line 13, as shown in FIG. 26, in one portion of the array of the MTJ elements 10, the orientation a1 of the magnetic field given to the MTJ element present at the left side of the write line 13 and the orientation a2 of the magnetic field given to the MTJ element present at the right side thereof are reverse to each other.

Therefore, with respect to the same write operation, the magnetization states of the two MTJ elements present at the right and left sides of the write line 13 are different from each other.

That is, in this case, assuming that the data stored in the two MTJ elements is same, it is required that the condition of "1"/"0" determination when reading the data stored in the MTJ element at the left side of the write line 13 and the condition of "1"/"0" determination when reading the data stored in the MTJ element at the right side of the write line 13 are reverse to each other.

According to such a device structure, at least one (in the present embodiment, the write line 13) of a plurality of conductive lines used for the data writing/reading is extended in the Z-axis direction. In other words, the conductive line extending in the Z-axis direction can be formed by the contact process, thereby capable of decreasing the number of multilayer wiring processes per portion of the array of the MTJ elements.

Accordingly, even when the number of accumulated portions of the MTJ elements is increased, the improvement of the flatness of the base films and the improvement of the characteristics of the MTJ elements can be realized.

Further, when the conductive lines used for the data writing/reading are three-dimensionally arranged, the degree of freedom of the layout of the conductive lines in the array can be increased. Furthermore, for example, when the write-only conductive line is extended in the Z-axis direction, this write-only conductive line can be arranged in the vicinity of the MTJ elements so that the variations of the magnetic fields given to the MTJ elements can be restricted.

In addition, one end of the write line extending in the Z-axis direction is present immediately below the array of the MTJ elements. Therefore, the transistor connected to the conductive line can be easily formed immediately below the array so that the concentration of the transistors on the periphery of the array can be alleviated.

In the present embodiment, in one portion of the array of the MTJ elements, one write line is corresponded to two MTJ elements adjacent in the X direction. That is, in one portion of the array of the MTJ elements, one write line is sandwiched by the two MTJ elements. Such a structure makes it possible to decrease the number of write lines extending in the Z-axis direction so that the high density of the MTJ elements can be accordingly realized.

In the present embodiment, a device structure is employed in which three types of conductive lines are arranged in the array of the MTJ elements and the respective lines are orthogonal to each other and extend in the different directions from each other. By doing so, the transistors connected to the respective lines can be arranged in a dispersed manner on the substrate.

However, in the present invention, it is enough that at least one conductive line extending in the Z direction is present. When a plurality of other conductive lines are present, they may extend in the same direction or in the different directions from each other.

④ Fourth Embodiment

In the aforementioned third embodiment, there is described the magnetic random access memory when the three types of the conductive lines are arranged in the array of the MTJ elements. In the present embodiment, there will be described a magnetic random access memory in which only two types of conductive lines having the same function as a read/write line are arranged in the array of the MTJ elements.

FIG. 24 shows a layout of a cell array section of a magnetic random access memory according to a fourth embodiment of the present invention.

A plurality of MTJ elements 10 are arranged in a plurality of portions (in the present embodiment, only one portion is illustrated for simplicity) on the semiconductor substrate. Further, the MTJ elements 10 construct the array in the X-Y plane in each portion.

The conductive patterns 11C are formed on the MTJ elements 10. The conductive line 13 functioning as a write line and read line (current path line) extends in the Z-axis direction, and is arranged in the vicinity of a plurality of MTJ elements 10 accumulated in the Z-axis direction. In addition, the conductive line 13 is connected to the conductive patterns 11C of a plurality of MTJ elements 10 accumulated in the Z-axis direction.

Moreover, in the present embodiment, in one portion of the array of the MTJ elements 10, one write line 13 is corresponded to two MTJ elements adjacent in the X direction. In other words, in one portion of the array of the MTJ elements, one write line 13 is sandwiched by the two MTJ elements.

With such a structure, the number of write lines 13 extending in the Z-axis direction can be decreased so that the high density of the MTJ elements can be accordingly realized.

The selective transistor (for example, MOS transistor) 14 is connected to one end of the conductive line 13 at the substrate side. This selective transistor 14 is arranged immediately below the array of the MTJ elements 10.

The lower line 12 functions as a write line and read line (current path line), and extends in the Y direction. The lower line 12 is in contact with, for example, the pin layers of the MTJ elements 10. Further, for example, the sense amplifier (S/A) is connected to one end of the lower line 12.

The data to be written in the MTJ element 10 (the orientation of the magnetization of the free layer) is determined by the synthetic magnetic field of the magnetic field generated by the current flowing through the lower line 12 in the Y-axis direction and the magnetic field generated by the current flowing through the write line 13 in the Z-axis direction.

According to such a device structure, at least one (in the present embodiment, the conductive line 13) of a plurality of conductive lines used for the data writing/reading is extended in the Z-axis direction. The conductive line extending in the Z-axis direction can be formed by the contact process so that the number of multilayer wiring processes per portion of the array of the MTJ elements can be decreased.

In the present embodiment, in each portion of the array of the MTJ elements, only one conductive line extends in the X direction or the Y direction so that the improvement of the flatness of the base films and the improvement of the characteristics of the MTJ elements can be further realized as compared with the aforementioned third embodiment.

Further, when the conductive lines used for data writing/reading are three-dimensionally arranged, the degree of freedom of the layout of the conductive lines in the array can be increased and the variations of the magnetic fields given to the MTJ elements can be restricted.

Furthermore, one end of the write line extending in the Z-axis direction is arranged immediately below the array of the MTJ elements. In other words, the transistor connected to the conductive line is arranged immediately below the array of the MTJ elements so that the concentration of the transistors on the periphery of the array can be alleviated.

In the present embodiment, in one portion of the array of the MTJ elements, one write line is corresponded to two MTJ elements adjacent in the X direction. That is, in one portion of the array of the MTJ elements, one write line is sandwiched by the two MTJ elements. Such a structure allows to decrease the number of write lines extending in the Z-axis direction so that the high density of the MTJ elements can be accordingly realized.

⑤ Fifth Embodiment

In the first to fourth embodiments described above, there is described the case where the write-only conductive line or the conductive line functioning as a read/write line is extended in the Z-axis direction. However, the present invention is characterized in that at least one of a plurality of types of conductive lines arranged in the array of the MTJ elements is extended in the Z-axis direction.

In the present embodiment, there will be described a case where the read-only conductive line is extended in the Z-axis direction.

Figure 25:
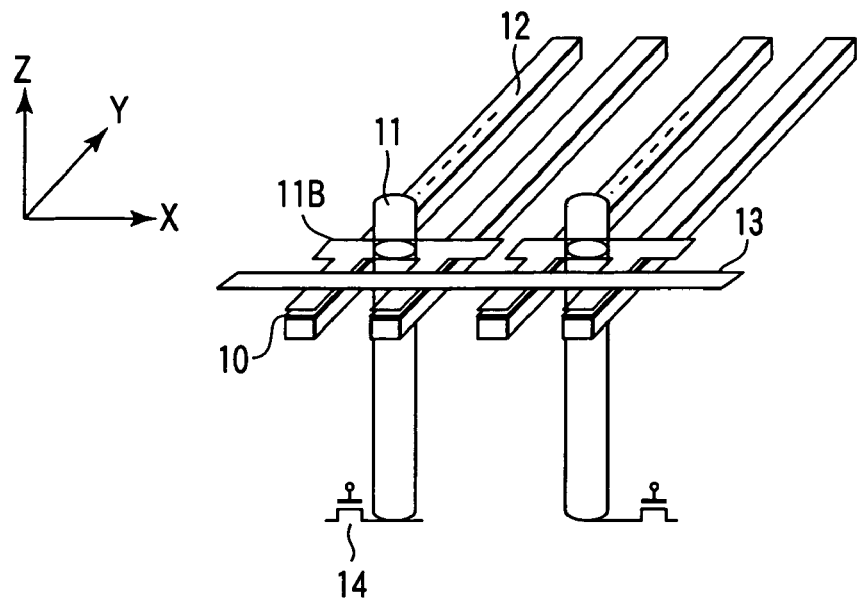
FIG. 25 is a perspective view showing a fifth embodiment of the invention relating to the three-dimensional wiring.

FIG. 25 shows a layout of a cell array section of a magnetic random access memory according to a fifth embodiment of the present invention.

A plurality of MTJ elements 10 are accumulated in a plurality of portions (in the present embodiment, only one portion is illustrated for simplicity) on the semiconductor substrate. Further, the MTJ elements 10 construct the array in the X-Y plane in each portion.

The conductive patterns 11C are formed on the MTJ elements 10. The read-only line (current path line) 11 extends in the Z-axis direction, and is arranged in the vicinity of a plurality of MTJ elements 10 accumulated in the Z-axis direction. Further, the read-only line 11 is commonly connected to the conductive patterns 11C of a plurality of MTJ elements 10 accumulated in the Z-axis direction.

Moreover, in the present embodiment, in one portion of the array of the MTJ elements 10, one read-only line 11 is corresponded to two MTJ elements adjacent in the X direction. In other words, in one portion of the array of the MTJ elements, one read-only line 11 is sandwiched by the two MTJ elements.

With such a structure, the number of read-only lines extending in the Z-axis direction can be decreased so that the high density of the MTJ elements can be accordingly realized.

The selective transistor (for example, MOS transistor) 14 is connected to one end of the read-only line 11 at the substrate side. This selective transistor 14 is arranged immediately below the array of the MTJ elements 10.

The write-only line 13 which is near but are not in contact with the MTJ elements 10 is arranged above the MTJ elements 10. The write-only line 13 extends in the X direction. The selective transistor is connected to one end or both ends of the write-only line 13.

The lower line 12 functions as a read line and write line, and extends in the Y direction. The lower line 12 is in contact with, for example, the pin layers of the MTJ elements 10. Further, the sense amplifier (S/A) is connected to one end of the lower line 12.

The data to be written in the MTJ element 10 (the orientation of the magnetization of the free layer) is determined by the synthetic magnetic field of the magnetic field generated by the current flowing through the lower line 12 in the Y-axis direction and the magnetic field generated by the current flowing through the write line 13 in the X-axis direction.

According to such a device structure, at least one (in the present embodiment, the read-only line 11) of a plurality of conductive lines used for the data writing/reading is extended in the Z-axis direction. That is, the line extending in the Z-axis direction can be formed by the contact process, thereby capable of decreasing the number of multilayer wiring processes per portion of the array of the MTJ elements.

In this way, even when the number of accumulated portions of the MTJ elements is increased, the improvement of the flatness of the base films and the improvement of the characteristics of the MTJ elements can be realized.

When the conductive lines used for data writing/reading are three-dimensionally arranged, the degree of freedom of the layout of the conductive lines in the array can be increased. Further, for example, when the read-only conductive line is extended in the Z-axis direction, the write-only conductive line extending in the X direction can be arranged immediately above and in the vicinity of the MTJ elements so that the variations of the magnetic fields given to the MTJ elements can be restricted.

In addition, one end of the read-only line extending in the Z-axis direction is present immediately below the array of the MTJ elements. Therefore, the transistor connected to the line can be easily formed immediately below the array so that the concentration of the transistors on the periphery of the array can be alleviated.

In the present embodiment, in one portion of the array of the MTJ elements, one read-only line is corresponded to two MTJ elements adjacent in the X direction. In other words, in one portion of the array of the MTJ elements, one read-only line is sandwiched by the two MTJ elements. With such a structure, the number of read-only lines extending in the Z-axis direction can be decreased so that the high density of the MTJ elements can be accordingly realized.

⑥ Sixth Embodiment

FIG. 27 shows a layout of a cell array section of a magnetic random access memory according to a sixth embodiment of the present invention.

A plurality of MTJ elements 10 are accumulated in a plurality of portions (in the present embodiment, three portions) on the semiconductor substrate. Further, the MTJ elements 10 construct the array in the X-Y plane in each portion.

The upper line 11 functions as a read line and extends in the X direction. The upper line 11 is in contact with, for example, the free layers of the MTJ elements 10. The lower line 12 functions as a read line and write line, and extends in the Y direction. The lower line 12 is in contact with, for example, the pin layers of the MTJ elements 10. Further, for example, the selective transistor is connected to one end of the upper line 11, and the sense amplifier (S/A) is connected to one end of the lower line 12.

The write line 13 extends in the Z-axis direction, and is arranged in the vicinity of a plurality of MTJ elements 10 accumulated in the Z-axis direction. The data to be written in the MTJ element 10 (the orientation of the magnetization of the free layer) is determined by the synthetic magnetic field of the magnetic field generated by the current flowing through the lower line 12 in the Y-axis direction and the magnetic field generated by the current flowing through the write line 13 in the Z-axis direction.

At least two write lines 13 are connected in serial to each other. The selective transistors (for example, MOS transistors) 14 are connected to one end and the other end of the write line 13 connected in serial, respectively. The selective transistors 14 are arranged immediately below the array of the MTJ elements 10.

Also in such a device structure, at least one (in the present embodiment, the write line 13) of a plurality of conductive lines used for the data writing/reading extends in the Z-axis direction. Accordingly, there can be obtained the same effect as the first embodiment, for example, the effect that, even when the number of accumulated portions of the MTJ elements is increased, the improvement of the flatness of the base films and the improvement of the characteristics of the MTJ elements can be realized.

(7) Seventh Embodiment

In the first to sixth embodiments described above, the conductive line extending in the Z-axis direction can be formed by the contact process. However, when the number of accumulated portions of the MTJ elements is remarkably increased, it is difficult to form contact holes by one etching.

In the present embodiment, there is proposed a technique in which the conductive line extending in the Z-axis direction is formed not one time but a plurality of times.

In FIG. 28, with respect to the array structure of the MTJ elements accumulated in a plurality of portions, there is proposed a technique in which the MTJ elements and the conductive line extending in the X-axis direction or the Y-axis direction are formed every portion and the conductive line extending in the Z-axis direction is also formed. In this case, the conductive line extending in the Z-axis direction is configured with a collection of a plurality of sections 1-1, 1-2, 1-3, and 1-4.

An example in FIG. 29 is an improvement of the technique of FIG. 28.

In the example of FIG. 28, when a deviation of alignment of the respective section 1-1, 1-2, 1-3, and 1-4 of the conductive line extending in the Z-axis direction occurs, the problems such as disconnection, increase in line resistance, and the like occur. In the example of FIG. 29, with respect to the array structure of the MTJ elements accumulated in a plurality of portions, the conductive line extending in the Z-axis direction is formed every portion and the intermediate layers 2-1, 2-2, and 2-3 are formed thereon in consideration of the deviation of the alignment. Thereby, even when the deviation of the alignment of the respective sections 1-1, 1-2, 1-3, and 1-4 of the conductive line extending in the X-axis direction occurs, the problems such as disconnection, increase in line resistance, and the like do not occur.

(4) Others

In the first to sixth embodiments described above, the transistors connected to the lines in the array of the MTJ elements are generally MOS transistors, but may be bipolar transistors, diodes, or the like.

In the present invention, the magnetic random access memory having an array structure in which a plurality of MTJ elements are accumulated in a plurality of portions can be applied to any devices having any structure.

(5) Conclusion

Hereinbefore, as described above, according to the magnetic random access memory according to the embodiments of the present invention, at least one of a plurality of types of lines arranged in the array of the MTJ elements is extended in the vertical direction (the direction in which the MTJ elements are accumulated).

Consequently, the number of lines extending in the transverse direction can be decreased so that the deterioration of the flatness of the base films is prevented and the deterioration of the characteristics of the MTJ elements can be restricted. Further, the degree of freedom of the lines in the array is improved so that the variations of the magnetic fields given to the MTJ elements are decreased. Furthermore, since the transistors can be arranged immediately below the array, the concentration of the transistors on the periphery of the array can be alleviated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   first and second array units which are accumulated on a semiconductor substrate; and
   write lines arranged between the first and second array units and extending in one direction,
   wherein each of the first and second array units comprises:
      magneto resistive elements arranged in a matrix;
      first conductive lines connected to first ends of the magneto resistive elements and extending in an other direction orthogonal to the one direction; and
      second conductive lines connected to second ends of the magneto resistive elements and extending in the other direction,
   wherein the first conductive lines of the first and second array units are connected to each other and the second conductive lines of the first and second array units are connected to each other.

2. The magnetic random access memory according to claim 1,
   wherein each of the magneto resistive elements comprises a first magnetic layer in which an orientation of a spin is pinned, a second magnetic layer in which data is stored, and an insulation layer sandwiched between the first and second magnetic layers.

3. The magnetic random access memory according to claim 2,
   wherein the magneto resistive elements of the first array unit and the magneto resistive elements of the second array unit are symmetric to the write lines.

4. The magnetic random access memory according to claim 1,
   wherein at least one of the first and second conductive lines functions as a write line.

* * * * *